(12) United States Patent
Jung et al.

(10) Patent No.: US 9,183,938 B2
(45) Date of Patent: Nov. 10, 2015

(54) NONVOLATILE MEMORY DEVICE AND METHOD OF PROGRAMMING NONVOLATILE MEMORY DEVICE

(71) Applicant: SAMSUNG ELECTRONICS CO., LTD., Suwon-si, Gyeonggi-do (KR)

(72) Inventors: Young Woo Jung, Osan-si (KR); Hee Tak Shin, Hwaseong-si (KR); Jinwoo Jung, Seoul (KR); Sung Woo Jo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/684,683

(22) Filed: Apr. 13, 2015

(65) Prior Publication Data

US 2015/0221382 A1    Aug. 6, 2015

Related U.S. Application Data

(63) Continuation of application No. 14/062,932, filed on Oct. 25, 2013, now Pat. No. 9,007,827.

(30) Foreign Application Priority Data

Oct. 31, 2012    (KR) .................. 10-2012-0122383

(51) Int. Cl.
  *G11C 11/34*    (2006.01)
  *G11C 16/16*    (2006.01)
  *G11C 16/04*    (2006.01)

(52) U.S. Cl.
  CPC ............ *G11C 16/16* (2013.01); *G11C 16/0466* (2013.01); *G11C 16/0483* (2013.01)

(58) Field of Classification Search
  CPC .................. G11C 11/5628; G11C 16/0483
  USPC .................. 365/185.03, 185.24
  See application file for complete search history.

(56) References Cited

U.S. PATENT DOCUMENTS

| | | |
|---|---|---|
| 6,219,277 B1 | 4/2001 | Devin et al. |
| 6,773,925 B2 | 8/2004 | Ibaraki et al. |
| 6,858,902 B1 | 2/2005 | Salling et al. |
| 6,865,122 B2 | 3/2005 | Srinivasan |
| 7,660,160 B2 | 2/2010 | Kim et al. |
| 8,019,921 B2 | 9/2011 | Patel |
| 8,225,063 B2 | 7/2012 | Sita |
| 8,332,680 B2 | 12/2012 | Best |
| 8,355,280 B2 | 1/2013 | Yoon et al. |
| 8,495,310 B2 | 7/2013 | Gregorius et al. |
| 8,531,909 B2 | 9/2013 | Kim |

(Continued)

FOREIGN PATENT DOCUMENTS

| | | |
|---|---|---|
| JP | 2011192343 | 9/2011 |
| KR | 100673020 B1 | 1/2007 |

(Continued)

*Primary Examiner* — Michael Tran
(74) *Attorney, Agent, or Firm* — Volentine & Whitt, PLLC

(57) ABSTRACT

A memory system includes a nonvolatile memory device and a memory controller. The nonvolatile memory device includes first memory blocks configured to store m-bit data per cell and second memory blocks configured to store n-bit data per cell. The memory controller is configured to control the nonvolatile memory device to close an open word line generated in a second memory block of the second memory blocks when a program operation is performed on the second memory block.

20 Claims, 25 Drawing Sheets

(56) References Cited

U.S. PATENT DOCUMENTS

| | | |
|---|---|---|
| 8,713,277 B2 | 4/2014 | Lilly et al. |
| 2004/0169238 A1 | 9/2004 | Lee et al. |
| 2005/0068836 A1* | 3/2005 | Oh ............................... 365/229 |
| 2006/0180851 A1 | 8/2006 | Lee et al. |
| 2010/0010040 A1 | 1/2010 | Jones et al. |
| 2010/0062715 A1 | 3/2010 | Kim et al. |
| 2010/0088574 A1 | 4/2010 | Kim et al. |
| 2010/0309237 A1 | 12/2010 | Roh |
| 2010/0315325 A1 | 12/2010 | Hwang |
| 2010/0331045 A1 | 12/2010 | La Rosa |
| 2013/0219109 A1 | 8/2013 | Kim et al. |

FOREIGN PATENT DOCUMENTS

| | | |
|---|---|---|
| KR | 1020070087895 A | 8/2007 |
| KR | 1020090041157 A | 4/2009 |
| KR | 1020100047560 A | 5/2010 |
| KR | 1020100098968 A | 9/2010 |
| KR | 1020100102925 A | 9/2010 |
| KR | 1020110030172 A | 3/2011 |
| KR | 1020110061625 A | 6/2011 |
| KR | 1020130096489 A | 8/2013 |

* cited by examiner

Fig. 10

| WLn | Pages | Program Order | | |
|---|---|---|---|---|
| | | 1st Program | 2nd Program | 3rd Program |
| WL6 | 18, 19, 20 | | | |
| WL5 | 15, 16, 17 | | | |
| WL4 | 12, 13, 14 | 10 | | |
| WL3 | 9, 10, 11 | 7 | 11 | |
| WL2 | 6, 7, 8 | 4 | 8 | 12 |
| WL1 | 3, 4, 5 | 2 | 5 | 9 |
| WL0 | 0, 1, 2 | 1 | 3 | 6 |

Close Programming ⇑

| WLn | Pages | Program Order | | |
|---|---|---|---|---|
| | | 1st Program | 2nd Program | 3rd Program |
| WL6 | 18, 19, 20 | | | |
| WL5 | 15, 16, 17 | | | |
| WL4 | 12, 13, 14 | 10 | | |
| WL3 | 9, 10, 11 | 7 | 11 | PD |
| WL2 | 6, 7, 8 | 4 | 8 | 12 |
| WL1 | 3, 4, 5 | 2 | 5 | 9 |
| WL0 | 0, 1, 2 | 1 | 3 | 6 |

Fig. 13

| WLn | Pages | Program Order | | |
|---|---|---|---|---|
| | | 1st Program | 2nd Program | 3rd Program |
| WL8 | 24, 25, 26 | | | |
| WL7 | 21, 22, 23 | | | |
| WL6 | 18, 19, 20 | | | |
| WL5 | 15, 16, 17 | | | |
| WL4 | 12, 13, 14 | 10 | | |
| WL3 | 9, 10, 11 | 7 | 11 | |
| WL2 | 6, 7, 8 | 4 | 8 | 12 |
| WL1 | 3, 4, 5 | 2 | 5 | 9 |
| WL0 | 0, 1, 2 | 1 | 3 | 6 |

Close Programming ⇒

| WLn | Pages | Program Order | | |
|---|---|---|---|---|
| | | 1st Program | 2nd Program | 3rd Program |
| WL8 | 24, 25, 26 | PD | PD | PD |
| WL7 | 21, 22, 23 | PD | PD | PD |
| WL6 | 18, 19, 20 | PD | PD | PD |
| WL5 | 15, 16, 17 | PD | PD | PD |
| WL4 | 12, 13, 14 | 10 | PD | PD |
| WL3 | 9, 10, 11 | 7 | 11 | PD |
| WL2 | 6, 7, 8 | 4 | 8 | 12 |
| WL1 | 3, 4, 5 | 2 | 5 | 9 |
| WL0 | 0, 1, 2 | 1 | 3 | 6 |

US 9,183,938 B2

NONVOLATILE MEMORY DEVICE AND METHOD OF PROGRAMMING NONVOLATILE MEMORY DEVICE

CROSS-REFERENCE TO RELATED APPLICATIONS

This application is a Continuation of U.S. application Ser. No. 14/062,932, filed Oct. 25, 2013, and claim for priority under 35 U.S.C. §119 is made to Korean Patent Application No. 10-2012-0122383, filed Oct. 31, 2012, in the Korean Intellectual Property Office, the entire contents of which are hereby incorporated by reference.

BACKGROUND

The inventive concepts described herein relate to a semiconductor memory device, and more particularly, relate to a memory system including a nonvolatile memory device and a memory controller.

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families.

Semiconductor memory devices may be characterized as volatile random access memories (RAMs), or non-volatile memory devices. In RAMs, the logic information is stored either by setting up the logic state of a bistable flip-flop, such as in a static random access memory (SRAM), or through the charging of a capacitor as in a dynamic random access memory (DRAM). In either case, the data are stored and can be read out as long as the power is applied, and are lost when the power is turned off; hence, they are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing the data, even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. In comparison, EEPROM is capable of being electrically erased or written. Application of the EEPROM has widened to auxiliary memory and to system programming where continuous updates are needed (e.g., flash EEPROM).

SUMMARY

One aspect of the inventive concept provides a memory system that includes a nonvolatile memory device and a memory controller. The nonvolatile memory device includes first memory blocks configured to store m-bit data per cell and second memory blocks configured to store n-bit data per cell. The memory controller is configured to control the nonvolatile memory device to close an open word line generated in a second memory block of the second memory blocks when a program operation is performed on the second memory block.

The open word line generated in the second memory block may be closed by completing a reprogram operation on memory cells connected to an upper word line immediately adjacent to the open word line.

Data used to perform the reprogram operation on the memory cells connected to the upper word line immediately adjacent to the open word line may be random data stored in one of the first memory blocks.

Data used to perform the reprogram operation on the memory cells connected to the upper word line immediately adjacent to the open word line may be provided from the memory controller. The data used to perform the reprogram operation on the memory cells connected to the upper word line immediately adjacent to the open word line may be randomized data.

The open word line generated in the second memory block may be closed by completing a reprogram operation on memory cells connected to remaining upper word lines adjacent to the open word line, including an upper word line immediately adjacent to the open word line.

The open word line generated in the second memory block may be closed together with word lines, connected to 1-step and 2-step programmed memory cells, from among upper word lines adjacent to the open word line including the word line immediately adjacent to the open word line. An empty storage space may be filled with padding data after the reprogram operation on the memory cells connected to the upper word lines is completed.

The m-bit data may be 1-bit data and the n-bit data may be 3-bit data.

Data provided from the memory controller may be stored in the plurality of first memory blocks via a buffer program operation, and the data stored in the first memory blocks is stored in the plurality of second memory blocks via a main program operation.

Another aspect of the inventive concept provides a method of programming a memory controller, which controls a nonvolatile memory device including a plurality of first memory blocks which store m-bit data per cell and a plurality of second memory blocks which store n-bit data per cell (n being a positive integer greater than m). The method includes controlling the nonvolatile memory device such that data stored in at least one first memory block of the plurality of first memory blocks is programmed into a second memory block of the plurality of second memory blocks; determining whether the programmed second memory block includes an open word line; and when the programmed second memory block includes an open word line, controlling the nonvolatile memory device such that the open word line of the programmed second memory block programmed is closed.

The open word line generated in the second memory block may be closed by completing a reprogram operation on memory cells connected to an upper word line adjacent to the open word line. Data used to perform the reprogram operation on the memory cells connected to the upper word line adjacent to the open word line may be random data stored in one of the first memory blocks or data provided from the memory controller.

The method may further include determining whether an empty storage space of the programmed second memory block including the open word line exceeds a reference value. When the empty storage space of the second memory block including the open word line exceeds the reference value, the open word line may be closed according to a first close policy, and when the empty storage space of the second memory block including the open word line does not exceed the reference value, the open word line may be closed according to a second close policy different from the first close policy. When the empty storage space of the second memory block including the open word line does not exceed the reference value, the empty storage space of the second memory block including the open word line may be filled with padding data.

Another aspect of the inventive concept provides a memory system that includes a nonvolatile memory device and a memory controller. The nonvolatile memory device is logically divided into a first memory area comprising a plurality of first memory blocks configured to store m-bit data per cell (where m is a positive integer) and a second memory area comprising a plurality of second memory blocks configured to store n-bit data per cell (where n is a positive integer greater than m). The memory controller is configured to determine whether an open word line has been generated in a selected second memory block of the second memory area following a write operation in the selected second memory block, and when the open word line has been generated, to control the nonvolatile memory device to close the open word line in the second memory block by at least performing a 3-step program operation on memory cells of an upper word line immediately adjacent to the open word line.

BRIEF DESCRIPTION OF THE FIGURES

Exemplary embodiments of the inventive concept will be more clearly understood from the following detailed description taken in conjunction with the accompanying drawings, in which like reference numerals refer to like parts throughout unless otherwise specified, and in which:

FIG. 10 is a diagram illustrating an example in which an open word line is closed, according to an embodiment of the inventive concept;

FIG. 13 is a diagram illustrating still another example in which an open word line is closed, according to an embodiment of the inventive concept;

DETAILED DESCRIPTION

Figure 1:
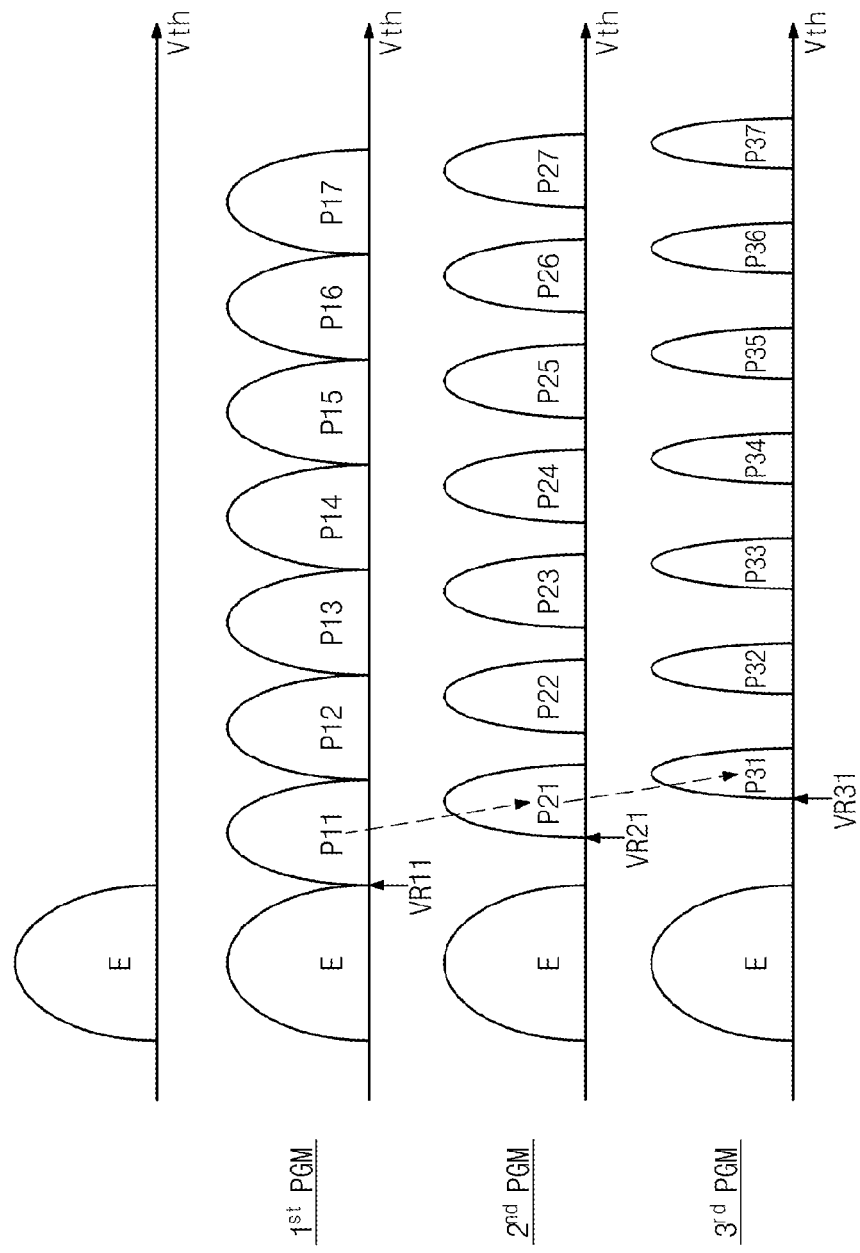
FIG. 1 is a diagram schematically illustrating a main program operation including a reprogramming method, according to an embodiment of the inventive concept.

Embodiments will be described in detail with reference to the following detailed description and accompanying drawings. The inventive concept, however, may be embodied in various different forms, and should not be construed as being limited only to the illustrated embodiments. Rather, these embodiments are provided so that this disclosure will be thorough and complete, and will fully convey the concept of the inventive concept to one of ordinary skill in the art. Accordingly, known processes, elements, and techniques may not be described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As the number of data bits stored in each memory cell increases (or, as the number of pages, or page data, corresponding to a word line increases), various programming techniques have been proposed. For example, an on-chip buffer program method may be applied to a memory system including a multi-bit memory device. It is possible to reduce the size of a buffer memory included in a memory controller of the memory system by using the on-chip buffer program method. The on-chip buffer program method may include programming data temporarily stored in the buffer memory of the memory controller at a first memory area of a multi-bit memory device, and programming data stored in the first memory area of the multi-bit memory device in a second memory area of the multi-bit memory device. Programming data temporarily stored in the buffer memory in the first memory area of the multi-bit memory device may be referred to as a buffer program operation, and programming data stored in the first memory area of the multi-bit memory device in the second memory area of the multi-bit memory device may be referred to as a main program operation. That is, the on-chip buffer program method may include a buffer program operation and a main program operation. The multi-bit memory device may further include other memory areas in addition to the first and second memory areas.

For example, the buffer program operation may be performed when data corresponding to a minimum program unit of the first memory area is gathered at the buffer memory of the memory controller. The main program operation may be performed when data corresponding to a minimum program unit of the second memory area is gathered at the first memory area of the multi-bit memory device, or when a usable storage space of the first memory area is insufficient. Herein, data corresponding to the minimum program unit of the first memory area may be a page of data, and data corresponding to the minimum program unit of the second memory area may be multiple pages of data. The number of multiple pages may be decided according to a cell-per-bit number. For example, in the event that the cell-per-bit number is 3, data corresponding to the minimum program unit of the second memory area may be 3-page data. It is understood that the minimum program units of the first and second memory areas are not limited to this disclosure. With the above description, data of the buffer memory may be programmed in the first memory area of the multi-bit memory device whenever data corresponding to the minimum program unit of the first memory area is gathered at the buffer memory. Thus, it is possible to reduce the size of the buffer memory.

In a memory system adopting the on-chip buffer program method, the main program operation may be performed using various programming methods. For example, the main program operation may be carried out according to a reprogramming method (or, reprogram operation). Below, the main program operation using the reprogramming method will be more fully described with reference to FIG. 1.

FIG. 1 is a diagram schematically illustrating a main program operation including a reprogramming method, according to an embodiment of the inventive concept. Referring to FIG. 1, there is illustrated an example in which 3-bit data (or, 3-page data) is programmed according to a reprogramming method. However, it is understood that the reprogramming method is not limited to 3-bit data according to various embodiments. The reprogramming method may include a first programming step, a second programming step, and a third programming step, which will be more fully described below.

During the first programming step, respective memory cells may be programmed from an erase state E to one state, corresponding to 3-bit data, from among eight states E and P11 to P17. Herein, the eight states E and P11 to P17 may be adjacent to one another with no read margins, as illustrated in FIG. 1. That is, the 3-bit data may be roughly programmed during the first programming. The 3-bit data may be data programmed in a first memory area via a buffer program operation, and may be read from the first memory area during the first programming step.

In various embodiments, the first programming may be performed in an Incremental Step Pulse Programming (ISPP) method, according to which the program voltage is incrementally increased at each iteration of program loops.

In various embodiments, the first programming step may include a verification operation. During the verification operation, at least one program state may be verified. For example, during the first programming, even program states P12, P14, and P16 may be verified, while odd program states P11, P13, and P15, and P17 may not be verified. That is, the first programming step may be completed when the program states P12, P14, and P16 are verify-passed.

The second programming step may be carried out to reprogram first programmed states P11 to P17 to denser states P21 to P27. Herein, the states P21 to P27 may be adjacent to one another with predetermined read margins, as illustrated in FIG. 1. That is, the 3-bit data programmed during the first programming step may be reprogrammed during the second programming step. As described above, the 3-bit data used during the second programming step may be the same as that used during the first programming step, and may be read from the first memory area. As illustrated in FIG. 1, the first-programmed state P11, for example, may be reprogrammed to a state P21 during the second programming step. As a result, the threshold voltage distribution corresponding to the state P21 becomes narrower in width than the threshold voltage distribution corresponding to the state P11. Therefore, verification voltage VR21 for verifying the second-programmed state P21 may be higher than verification voltage VR11 for verifying the first-programmed state P11.

In various embodiments, the second programming step may be performed in an ISPP method. Also, in various embodiments, the second programming step may include a verification operation. All program states may be verified during the verification operation of the second programming. That is, the second programming step may be completed when all program states P21 to P27 are verify-passed.

The third programming step may be carried out to reprogram second programmed states P21 to P27 to denser states P31 to P37. Herein, the states P31 to P37 may be adjacent to one another with predetermined read margins larger than those of the second programming step, as illustrated in FIG. 1. That is, the 3-bit data programmed during the second programming step may be reprogrammed during the third programming step. As described above, the 3-bit data used during the third programming step may be equal to that used during the first and second programming steps, and may be read from the first memory area. As the third programming step is executed, the second-programmed state P21, for example, may be reprogrammed to a state P31. As a result, the threshold voltage distribution corresponding to the third-programmed state P31 may be narrower in width than the threshold voltage corresponding to the second-programmed state P21. Therefore, verification voltage VR31 for verifying the third-programmed state P31 may be higher than verification voltage VR21 for verifying the second-programmed state P21.

In various embodiments, the third programming step may be performed in an ISPP method. Also, in various embodiments, all program states may be verified during a verification operation of the third programming step. That is, the third programming step may be completed when all program states P31 to P37 are verify-passed.

Embodiments are not limited to the above example of 3-bit data being programmed during the first programming step. For example, the inventive concept is applicable to 2-bit data being programmed during the first programming step. After the 2-bit data is first programmed, second programming may be executed to program 1-bit data. Afterwards, third programming may be performed to obtain target threshold voltage distributions. This programming method is disclosed, for example, in U.S. Patent Publication No. 2011/0222342 to Yoon et al. (published Sep. 15, 2011), the entire contents of which are hereby incorporated by reference.

A program operation illustrated in FIG. 1 may be performed in a 3-step reprogramming method. However, the inventive concept is not limited thereto. In the inventive concept, a program operation including a reprogramming method may include three programming operations executed to narrow a threshold voltage distribution corresponding to a data value to be stored (or, to finely form a threshold voltage distribution).

Figure 2:
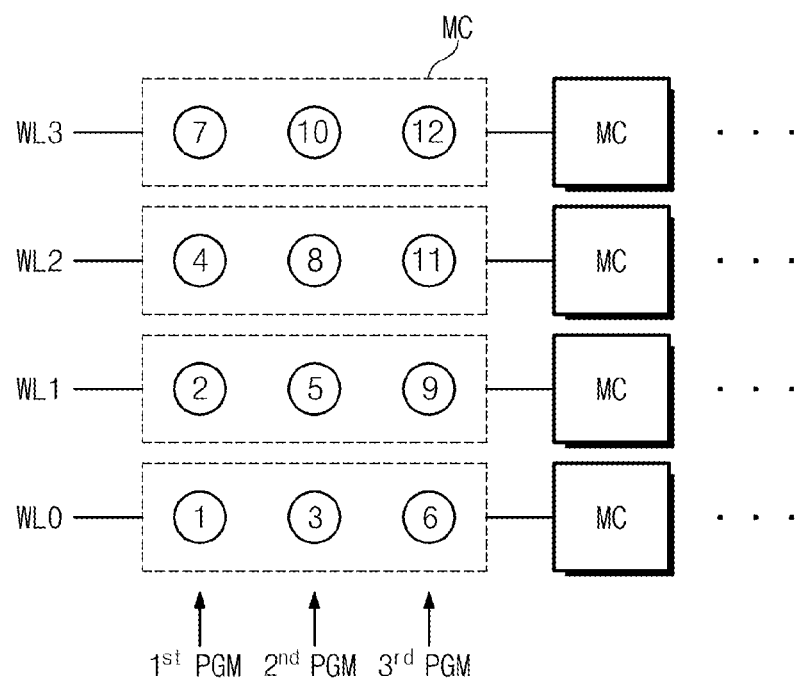
FIG. 2 is a diagram illustrating an address scramble method applied to a multi-level memory device, according to an embodiment of the inventive concept.

FIG. 2 is a diagram illustrating an address scramble method applied to a multi-level memory device, according to an embodiment of the inventive concept.

With an increase in the number of data bits stored in each memory cell, it is increasingly difficult to secure reliability of a memory device storing multi-bit (or, multi-level) data, which is hereinafter referred to as a multi-level memory device. A representative factor causing degradation of the reliability may be variation of threshold voltages due to the coupling between adjacent memory cells. For example, a threshold voltage of a previously programmed memory cell varies due to coupling caused the programming of a memory cell adjacent to the programmed memory cell. An address scramble method may be used to manage the coupling effectively. The address scramble method will be described under the assumption that 3-bit data is stored in one memory cell. For ease of illustration, in FIG. 2, only four representative word lines WL0 to WL3 are shown.

Referring to FIG. 2, a plurality of memory cells MC are connected to word lines WL0 to WL3. First of all, a 1-step program operation may be performed in which 3-bit data is stored in each memory cell connected to the first word line WL0. That is, during the 1-step program operation, 3-page data may be stored in the memory cells connected to the first word line WL0. This is indicated by ① in FIG. 2. Then, a 1-step program operation may be performed with respect to memory cells connected to the second word line WL1. This is indicated by ② in FIG. 2. After the 1-step program operation is performed with respect to the second word line WL1, a 2-step program operation may be performed with respect to the first word line WL0, which is placed below the second word line WL1, by which 3-bit data is programmed. This is indicated by ③ in FIG. 2. Following the 2-step program operation on memory cells connected to the first word line WL0, a 1-step program operation may be performed with respect to the third word line WL2. This is indicated by ④ in FIG. 2. After the 1-step program operation on the third word line WL2, a 2-step program operation may be performed on memory cells connected to the second word line WL1 by which 3-bit data is stored. This is indicated by ⑤ in FIG. 2. Afterwards, a 3-step program operation may be performed on the first word line WL0. This is indicated by ⑥ in FIG. 2. Afterwards, 1-step, 2-step, and 3-step program operations may be performed sequentially according to the above-described program order, indicated by 7 to 12 in FIG. 2. The manner in which word lines are selected according to the program order described in FIG. 2 may be called the address scramble method.

Figure 3:
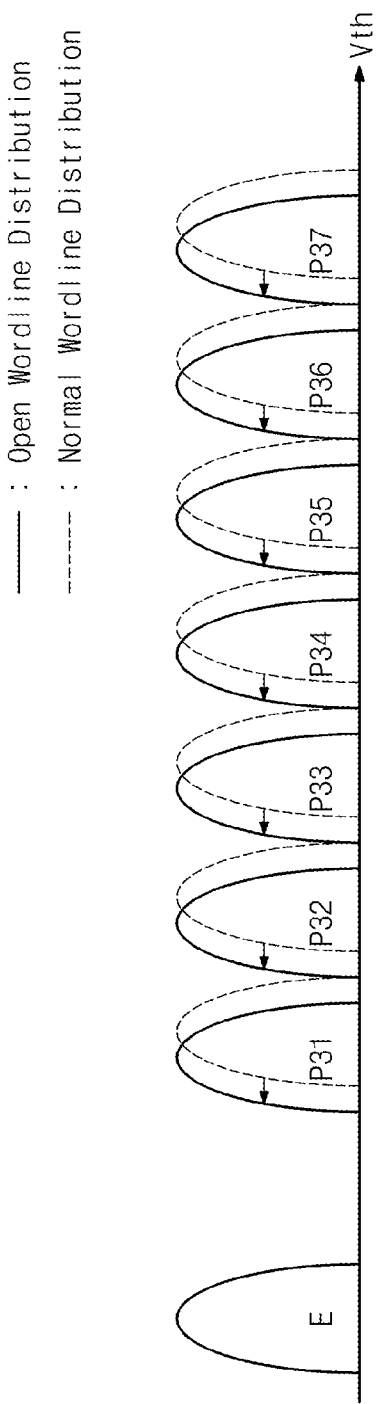
FIG. 3 is a diagram illustrating threshold voltage distributions of memory cells connected to an open word line and threshold voltage distributions of memory cells connected to a normal word line.

FIG. 3 is a diagram illustrating threshold voltage distributions of memory cells connected to an open word line and threshold voltage distributions of memory cells connected to a normal word line.

Threshold voltage distributions of 3-step programmed memory cells connected to an nth word line may have target threshold voltage distributions when memory cells connected to an (n+1)th word line are 3-step programmed. In other words, when 3-step programmed memory cells connected to the nth word line experience coupling caused by a 3-step program operation on memory cells connected to the (n+1)th word line, target threshold voltage distributions of 3-step programmed memory cells connected to the nth word line may be finally formed. If 3-step programming on memory cells connected to the (n+1)th word line is not performed, threshold voltage distributions of 3-step programmed memory cells connected to the nth word line may not reach target threshold voltage distributions. Herein, when 3-step programming on memory cells connected to the nth word line is not performed, the nth word line may be called an open word line. On the other hand, when 3-step programming on memory cells connected to the (n+1)th word line is performed, the (n+1)th word line may be called a normal word line.

In view of the above description, as illustrated in FIG. 3, threshold voltage distributions (indicated by dotted lines) of memory cells connected to an open word line may not reach threshold voltage distributions (indicated by solid lines) of memory cells connected to a normal word line. Although 3-step programming on memory cells connected to an open word line is executed, it is difficult to secure validity of data stored in the memory cells connected to the open word line. In other words, when 3-step programming on memory cells connected to an (n+1)th word line is not executed, the coupling forced to the memory cells connected to the open word line may be insufficient, so that probability increases that an uncorrectable error may be generated.

Figure 4:
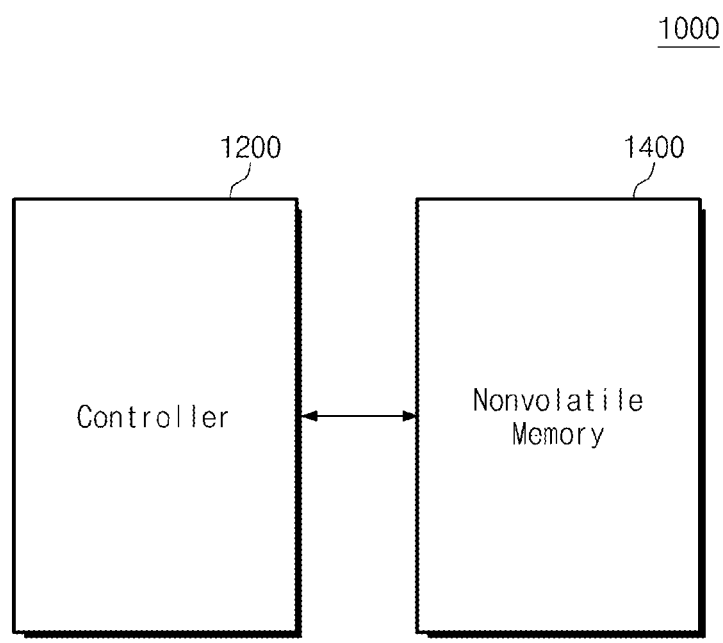
FIG. 4 is a block diagram schematically illustrating a memory system, according to an embodiment of the inventive concept.

FIG. 4 is a block diagram schematically illustrating a memory system, according to an embodiment of the inventive concept.

Referring to FIG. 4, a memory system 1000 according to an embodiment of the inventive concept includes a memory controller 1200 and a nonvolatile memory device 1400 as a multi-bit memory device. The memory controller 1200 may be configured to control the nonvolatile memory device 1400 according to an external request (e.g., a write request, a read request, etc.). The memory controller 1200 may also be configured to control the nonvolatile memory device 1400 according to an internal request (e.g., an operation associated with sudden power-off, a wear-leveling operation, a read reclaim operation, etc.) without an external request. An operation corresponding to an internal request of the memory controller 1200 may be executed within a timeout period of a host after a host request is processed. Alternatively, an operation corresponding to an internal request of the memory controller 1200 may be executed within an idle time of the memory controller 1200. The nonvolatile memory device 1400 may operate in response to the control of the memory controller 1200, and may be used as a type of storage medium that stores data information. The storage medium may be formed of one or more memory chips. The nonvolatile memory device 1400 may communicate with the memory controller 1200 via one or more channels. The nonvolatile memory device 1400 may include a NAND flash memory device, for example.

The memory system 1000 may use the above-described on-chip buffer program method. As further described below, the nonvolatile memory device 1400 may include a memory cell array having a first memory area and a second memory area. In various embodiments, the first memory area may be formed of first memory blocks which store 1-bit data per cell, and the second memory area may be formed of second memory blocks which store 3-bit data per cell. When a program operation is performed, the memory controller 1200 determines whether an open word line has been generated in a second memory block. When the requested program operation generates an open word line, the memory controller 1200 controls the nonvolatile memory device 1200 such that the open word line of the second block is closed. Herein, closing of the open word line may be accomplished by performing a 3-step program operation on an upper word line adjacent to the open word line. It is possible to secure the validity of data stored in memory cells connected to an open word line by closing the open word line.

Figure 5:
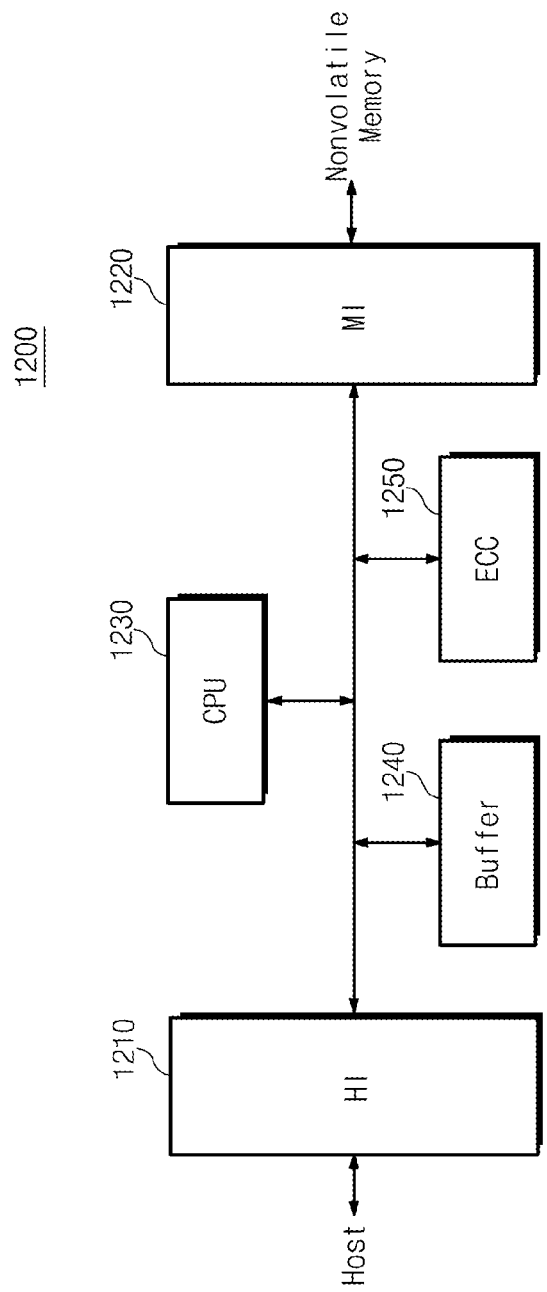
FIG. 5 is a block diagram schematically illustrating a memory controller in FIG. 4, according to an embodiment of the inventive concept.

FIG. 5 is a block diagram schematically illustrating a memory controller in FIG. 4, according to an embodiment of the inventive concept. Referring to FIG. 5, the memory controller 1200 includes a host interface 1210 as a first interface, a memory interface 1220 as a second interface, a central processing unit (CPU) 1230, a buffer memory 1240, and an error detecting and correcting circuit (ECC) 1250.

The host interface 1210 is configured to interface with an external device (for example, a host), and the memory interface 1220 is configured to interface with a nonvolatile memory device 1400, e.g., illustrated in FIG. 4. The CPU 1230 is configured to control overall operation of the controller 1200. The CPU 1230 may be configured to operate firmware, such as Flash Translation Layer (FTL), for example. The FTL may perform a variety of functions. For example, the FTL may include a variety of layers performing an address mapping operation, a read reclaim operation, an error correction operation, an open word line closing operation, and so on. The CPU 1230 (or, the FTL executed by the CPU 1230) is configured to determine whether a requested program operation generates an open word line. When it is determined that the requested program operation generates an open word line, the CPU 1230 (or, the FTL executed by the CPU 1230) controls the nonvolatile memory device 1400 such that the open word line is closed.

The buffer memory 1240 temporarily stores data transferred from an external device via the host interface 1210 or data to be transferred from the nonvolatile memory device 1400 via the memory interface 1220. The buffer memory 1240 may store information (e.g., information indicating source memory blocks needed for a read reclaim operation, address mapping information, etc.) necessary to control the nonvolatile memory device 1400. The buffer memory 1240 may be formed of DRAM, SRAM, or a combination of DRAM and SRAM. However, embodiments of the inventive concept are not limited thereto. The ECC 1250 is configured to encode data to be stored in the nonvolatile memory device 1400 and to decode data read out from the nonvolatile memory device 1400.

Although not illustrated in figures, the memory controller 1200 may further include a randomizer/de-randomizer which is configured to randomize data to be stored in the nonvolatile memory device 1400 and to de-randomize data read from the nonvolatile memory device 1400. An example of the randomizer/de-randomizer is disclosed in U.S. Patent Publication No. 2010/0088574 to Kim et al. (published Apr. 8, 2010), the entire contents of which are hereby incorporated by reference.

In various embodiments, the host interface 1210 may be formed of one of computer bus standards, storage bus standards, and iFCPPeripheral bus standards, or a combination of two or more standards. The computer bus standards may include, for example, S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, HyperTransport, and the like. The storage bus standards may include, for example, ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 6:
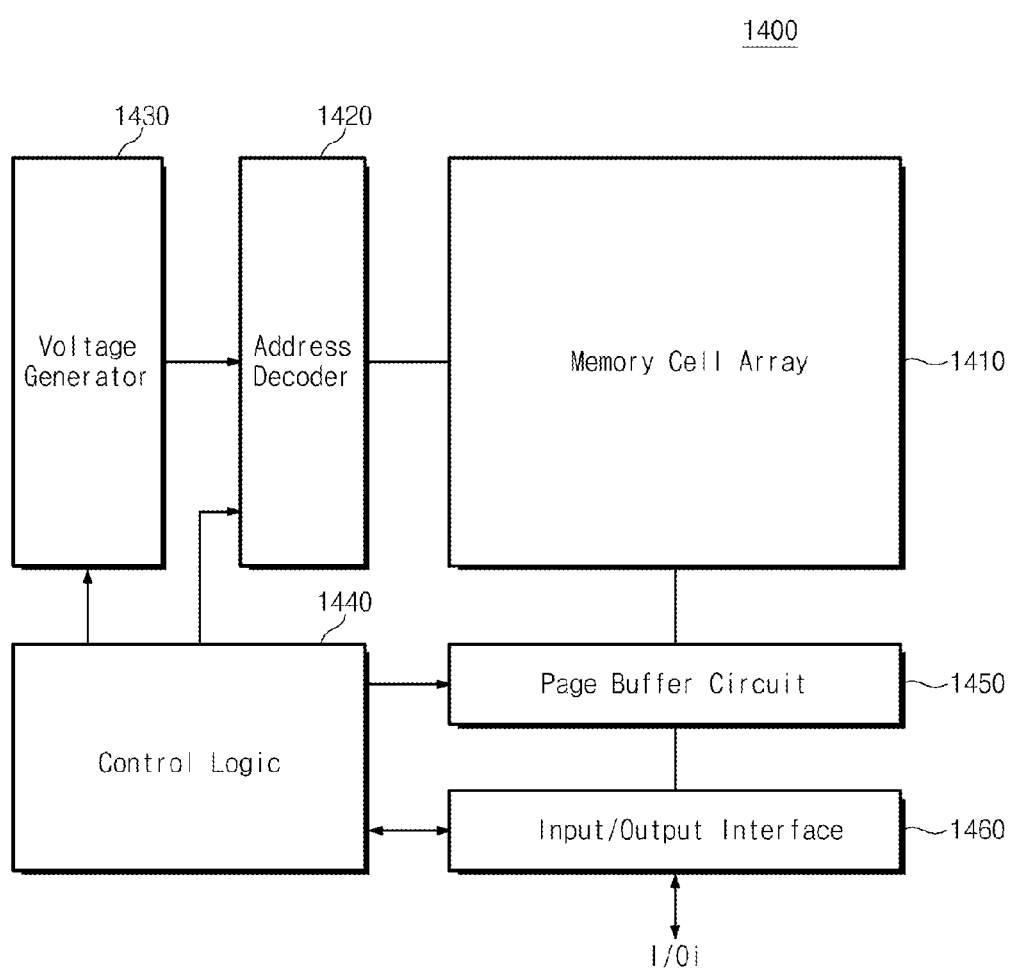
FIG. 6 is a block diagram schematically illustrating a nonvolatile memory device in FIG. 4, according to an embodiment of the inventive concept.

FIG. 6 is a block diagram schematically illustrating a nonvolatile memory device in FIG. 4, according to an embodiment of the inventive concept.

The nonvolatile memory device 1400 may be a NAND flash memory device, for example. However, it is understood that the nonvolatile memory device 1400 is not limited to the NAND flash memory device. For example, embodiments of the inventive concept may be applied to a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, a Spin Transfer Torque Random Access Memory (STT-RAM), and the like. Further, the nonvolatile memory device 1400 may be implemented to have a three-dimensional array structure. A nonvolatile memory device with the three-dimensional array structure may be referred to as a vertical NAND flash memory device. Embodiments of the inventive concept may be applied to a Charge Trap Flash (CTF) memory device including a charge storage layer formed of an insulation film as well as a flash memory device including a charge storage layer formed of a conductive floating gate.

Referring to FIG. 6, the nonvolatile memory device 1400 includes a memory cell array 1410, an address decoder 1420, a voltage generator 1430, control logic 1440, a page buffer circuit 1450, and an input/output interface 1460.

The memory cell array 1410 may include memory cells arranged at intersections of rows (e.g., word lines) and columns (e.g., bit lines). Each memory cell may store 1-bit data or M-bit data as multi-bit data (M being an integer of 2 or more). The address decoder 1420 is controlled by the control logic 1440, and performs selecting and driving operations on rows (e.g., word lines, string selection line(s), ground selection line(s), common source line, etc.) of the memory cell array 1410. The voltage generator 1430 is controlled by the control logic 1440, and generates voltages required for each operation such as a high voltage, a program voltage, a read voltage, a verification voltage, an erase voltage, a pass voltage, a bulk voltage, and the like. Voltages generated by the voltage generator 1430 are provided to the memory cell array 1410 via the address decoder 1420. The control logic 1440 is configured to control overall operation of the nonvolatile memory device 1400.

The page buffer circuit 1450 is controlled by the control logic 1440, and is configured to read data from the memory cell array 1410 and to drive columns (e.g., bit lines) of the memory cell array 1410 according to program data. The page buffer circuit 1450 includes page buffers respectively corresponding to bit lines or bit line pairs. Each of the page buffers may include a plurality of latches. The input/output interface 1460 is controlled by the control logic 1440, and interfaces with an external device (e.g., a memory controller in FIG. 2). Although not illustrated in FIG. 4, the input/output interface 1460 may include a column decoder configured to select page buffers of the page buffer circuit 1450 by predetermined unit, an input buffer for receiving data, an output buffer for outputting data, and so on.

Figure 7:
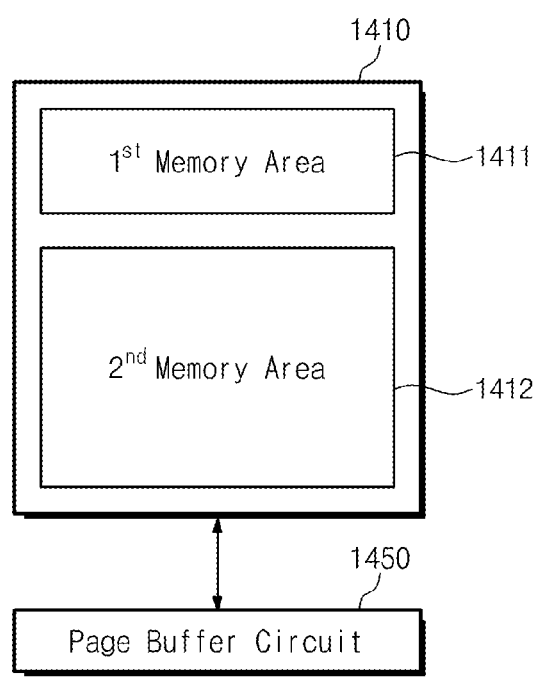
FIG. 7 is a block diagram schematically illustrating a memory cell array in FIG. 6, according to an embodiment of the inventive concept.

FIG. 7 is a block diagram schematically illustrating a memory cell array in FIG. 6, according to an embodiment of the inventive concept.

Referring to FIG. 7, the memory cell array 1410 includes a plurality of memory blocks, which are divided into a first memory area 1411 and a second memory area 1412. Herein, it is understood that division of the first and second memory areas 1411 and 1412 may be made logically, not physically. Division of the first and second memory areas 1411 and 1412 can therefore be changed logically. In other words, physical sizes of the first and second memory areas 1411 and 1412 may be changed logically under the control of a memory controller 1200. Memory blocks in the first memory area 1411 may be programmed in a manner different from memory blocks in the second memory area 1412. For example, memory blocks in the first memory area 1411 may be programmed according to a single-bit programming method (hereinafter, referred to as a single-level cell (SLC) programming method), and memory blocks in the second memory area 1412 may be programmed according to a multi-bit programming method (hereinafter, referred to as a multi-level cell (MLC)/triple level cell (TLC) programming method) (e.g., the above-described 3-step reprogramming method). In other words, each memory cell in the first memory area 1411 may store 1-bit data, while each memory cell in the second memory area 1412 may store M-bit data (M being an integer of 3 or more). The number of data bits stored in each of memory cells in the first memory area 1411 may be less than the number of data bits stored in each of memory cells in the second memory area 1412. It is understood, though, that each memory cell in the first memory area 1411 is not limited to store 1-bit data.

As described above, data provided from the memory controller 1200 is programmed in the first memory area 1411 via a buffer program operation. Data for a main program operation is read out from the first memory area 1411, and the read data is programmed in the second memory area 1412 via the main program operation.

FIGS. 8A to 8D are functional block diagrams of a memory system for describing various combinations of first and second memory areas of a multi-bit memory device, according to embodiments of the inventive concept. In the figures, "BP" indicates buffer programming in a first memory area 1411, and "MP" indicates main programming in a second memory area 1412.

As described above, a multi-bit memory device 1400 includes the first memory area 1411 and the second memory area 1412. Herein, the first and second memory areas 1411 and 1412 may be included in a memory cell array of the multi-bit memory device 1400. Although not illustrated in figures, the memory cell array may further include areas such as a meta area, a reserved area, and so on. It is understood that areas of the memory cell array may be divided logically, not physically. This means that such areas of the memory cell array are defined according to address mapping of a memory controller 1200.

Figure 8A:
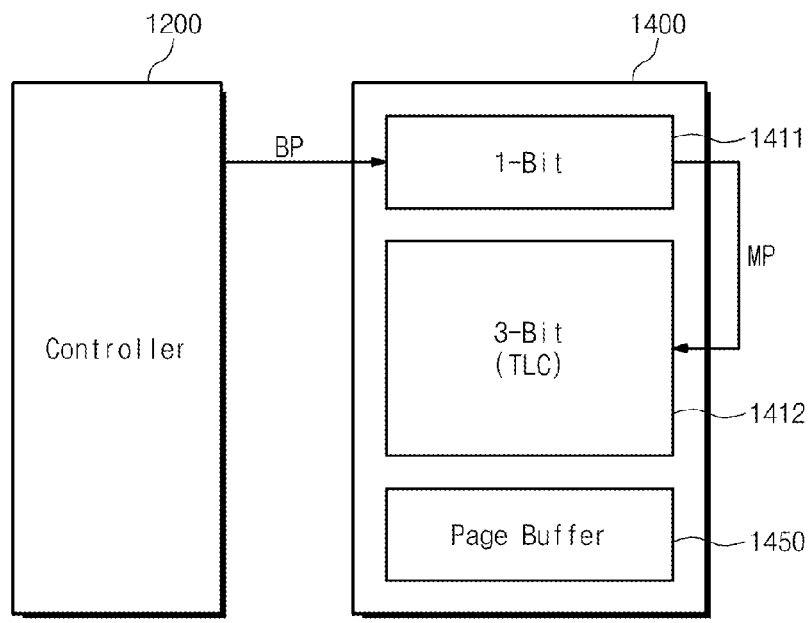
FIGS. 8A to 8D are diagrams for describing various combinations of first and second memory areas of a multi-bit memory device, according to embodiments of the inventive concept.

Referring to FIG. 8A, when a multi-bit memory device is configured to store 3-bit data per cell, the first memory area 1411 may be formed of memory cells each storing 1-bit data, and the second memory area 1412 may be formed of memory cells each storing 3-bit data. In this case, buffer programming may be executed according to an SLC programming method, and main programming may be performed according to the above-described MLC/TLC programming method.

Figure 8B:
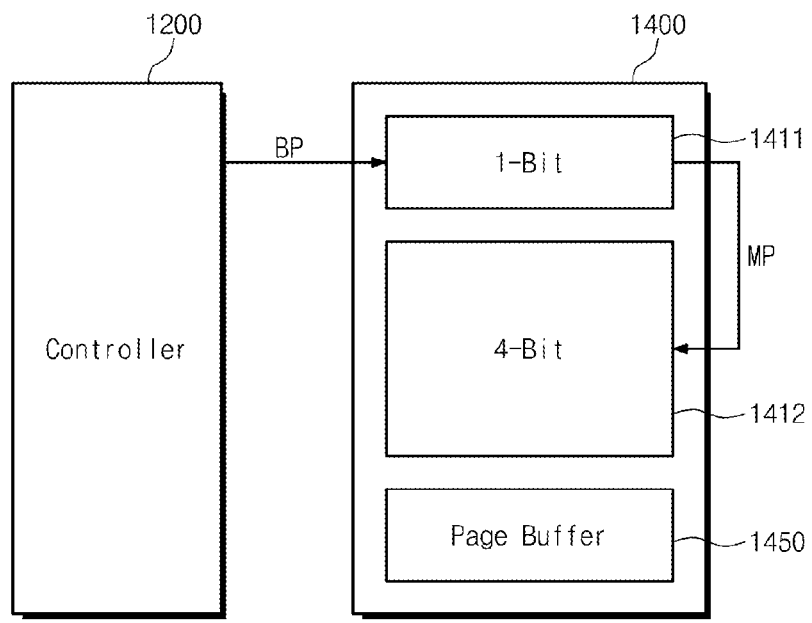

Referring to FIG. 8B, when a multi-bit memory device is configured to store 4-bit data per cell, the first memory area 1411 may be formed of memory cells each storing 1-bit data, and the second memory area 1412 may be formed of memory cells each storing 4-bit data. In this case, buffer programming may be executed according to an SLC programming method, and main programming may be performed according to the above-described MLC/TLC programming method.

Figure 8C:
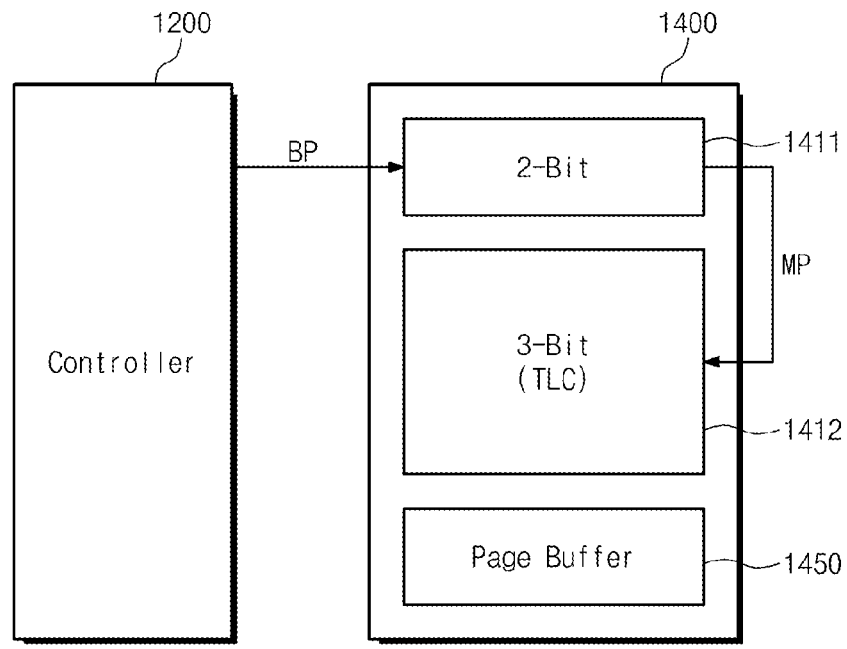

Referring to FIG. 8C, when a multi-bit memory device is configured to store 3-bit data per cell, the first memory area 1411 may be formed of memory cells each storing 2-bit data, and the second memory area 1412 may be formed of memory cells each storing 3-bit data. In this case, buffer programming may be executed according to the above-described or conventional MLC programming method, and main programming may be performed according to the above-described MLC/TLC programming method (e.g., a reprogramming method).

Figure 8D:
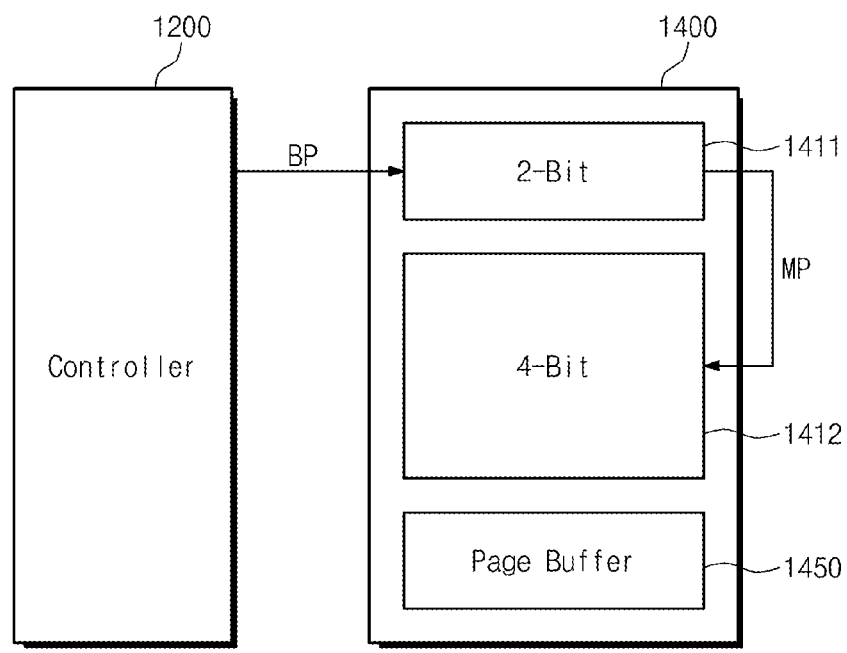

Referring to FIG. 8D, when a multi-bit memory device is configured to store 4-bit data per cell, the first memory area 1411 may be formed of memory cells each storing 2-bit data, and the second memory area 1412 may be formed of memory cells each storing 4-bit data. In this case, buffer programming may be executed according to the above-described or conventional MLC programming method, and main programming may be performed according to the above-described MLC/TLC programming method (e.g., a reprogramming method).

In exemplary embodiments, it is understood that defining of the first and second memory areas 1411 and 1412 illustrated in FIGS. 8A to 8D is not limited to the examples in this disclosure. For example, if the storage medium included in the memory system is formed of a plurality of multi-bit memory devices, the first and second memory areas 1411 and 1412 may be defined with respect to the respective multi-bit memory devices. Alternatively, each of memory cell arrays of one or more multi-bit memory devices may be defined as the first memory area 1411. Each of memory cell arrays of the remaining multi-bit memory devices may be defined as the second memory area 1412.

Figure 9:
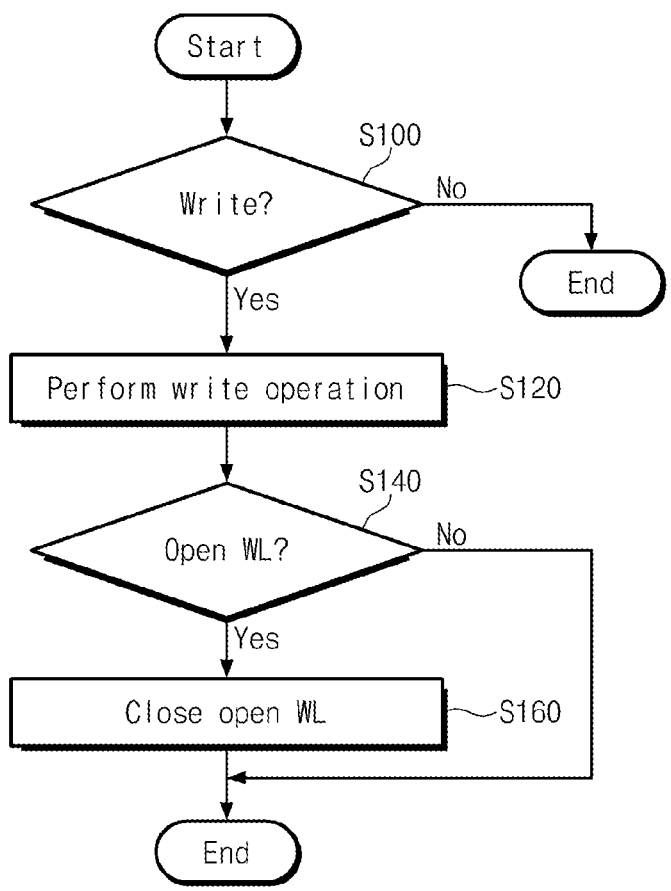
FIG. 9 is a flow chart illustrating a method of programming a memory system, according to an embodiment of the inventive concept.

FIG. 9 is a flow chart illustrating a method of programming a memory system, according to an embodiment of the inventive concept.

When the memory system 1000 adopts an on-chip buffer program method, data write requested by an external device is programmed into a first memory area 1411 via a buffer program operation. The data stored in the first memory area 1411 is programmed into a second memory area 1412 via a reprogramming method as a main program operation according to scheduling of the memory controller 1200. The data stored in the first memory area 1411 has to be retained as valid data until a 3-step program operation ends. Herein, the data stored in the first memory area 1411 may be maintained as valid data according to mapping information managed by the memory controller 1200.

Referring to FIG. 9, whether a write operation is required is determined in operation S100. Herein, the write operation may be requested externally by the external device or internally by the memory controller 1200. In exemplary embodiments, the write operation may be a write operation in the second memory area 1412. The write operation in the second memory area 1412 may be performed based on data stored in the first memory area 1411. When it is determined that the write operation is not required, the process ends. When it is determined that the write operation is required, the write operation is performed in the second memory area 1412 in operation S120.

After the write operation in the second memory area 1412 is performed, in operation S140, the memory controller 1200 determines whether an open word line has been generated in the second memory area 1412. For example, the memory controller 1200 may determine whether an open word line has been generated at a selected memory block of the second memory area 1412. When an open word line is generated, the method proceeds to operation S160. In operation S160, the memory controller 1200 controls the nonvolatile memory device 1400 such that the open word line of the selected memory block is closed. After the open word line of the selected memory block is closed, or after it is determined that no open word line has been generated, the process ends.

The open word line may be closed using various methods. For example, an open word line may be closed by performing a 3-step program operation on an upper word line adjacent to the open word line. Alternatively, an open word line may be closed by performing a reprogram operation on all word lines between the open word line and a string selection line. However, the inventive concept is not limited thereto. Various examples of methods for closing an open word line are described below.

FIG. 10 is a diagram illustrating an example in which an open word line is closed, according to an embodiment of the inventive concept.

In FIG. 10, there is illustrated a program order associated with seven word lines WL0 to WL6. Each of second memory blocks in a second memory area 1412 may be programmed via a reprogram operation. It is assumed that a write operation on a selected second memory block of the second memory area 1412 ends as illustrated by the left table of FIG. 10. In this case, word line WL2 is an open word line. According to an embodiment of the inventive concept, as illustrated in FIG. 10, the open word line WL2 is closed by performing a 3-step program operation on memory cells of an upper word line WL3 immediately adjacent to the open word line WL2.

In particular, when the open word line WL2 is closed by performing a 3-step program operation on memory cells of the upper word line WL3 immediately adjacent to the open word line WL2, an open word line closing operation is ended. In this case, 6-page data 9 to 14 stored in memory cells connected to word lines WL3 and WL4 may be invalid. However, since 6-page data 9 to 14 stored in memory cells connected to word lines WL3 and WL4 are stored in a first memory area 1411, during a read operation of a host, data stored in the first memory area 1411 may be read as valid data according to a read request of the host. As described above, the memory controller 1200 manages mapping information so as to indicate that the 6-page data stored in the second memory area 1412 is stored in the first memory area 1411.

In exemplary embodiments, 3-page data, or padding data (PD), used to 3-step program memory cells of the word line WL3 may be data stored in the first memory area 1411 and used to perform 1-step and 2-step program operations on the word line WL3. Alternatively, the 3-page data PD used to 3-step program memory cells of the word line WL3 may be random data stored in the first memory area 1411. The 3-page data PD used to 3-step program memory cells of the word line WL3 may be data read from the first memory area 1411 via the page buffer circuit 1450 under the control of the memory controller 1200.

In other exemplary embodiments, the 3-page data PD used to 3-step program memory cells of the word line WL3 may be data provided from the memory controller 1200. The data provided from the memory controller 1200 may be randomized data, for example. The data provided from the memory controller 1200 may be programmed in the second memory area 1412 via the page buffer circuit 1450.

Figure 11:
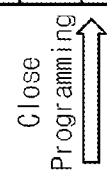
FIG. 11 is a diagram illustrating another example in which an open word line is closed, according to an embodiment of the inventive concept.

FIG. 11 is a diagram illustrating another example in which an open word line is closed, according to an embodiment of the inventive concept.

In FIG. 11, there is illustrated a program order associated with seven word lines WL0 to WL6. Each of second memory blocks in a second memory area 1412 may be programmed via a reprogram operation. It is assumed that a write operation on a selected second memory block of the second memory area 1412 ends as illustrated by the left table of FIG. 11. In this case, a word line WL2 is an open word line. In an embodiment of the inventive concept, as illustrated in FIG. 11, the open word line WL2 may be closed by 1-step programming memory cells of an upper word line WL5 adjacent to the open word line WL2, 2-step programming memory cells of an upper word line WL4 adjacent to the open word line WL2, and 3-step programming memory cells of an upper word line WL3 immediately adjacent to the open word line WL2.

When the open word line WL2 is closed by performing a 3-step program operation on memory cells of an upper word line WL3 immediately adjacent to the open word line WL2, the open word line closing operation ends. In this case, 6-page data 9 to 14 stored in memory cells connected to word lines WL3 and WL4 may be invalid. However, since the 6-page data 9 to 14 stored in memory cells connected to word lines WL3 and WL4 are stored in a first memory area 1411, during a read operation of a host, data stored in the first memory area 1411 may be read as valid data according to a read request of the host. As described above, the memory controller 1200 manages mapping information so as to indicate that the 6-page data stored in the second memory area 1412 is stored in the first memory area 1411.

In exemplary embodiments, the 3-page data PD used to 1-step program memory cells of the word line WL5 may be random data stored in the first memory area 1411 or data provided from the memory controller 1200. The 3-page data PD used to 2-step program memory cells of the word line WL4 may be data stored in the first memory area 1411 and used to perform the 1-step program operation of the word line WL4, random data stored in the first memory area 1411, or data provided from the memory controller 1200. The 3-page data PD used to 3-step program memory cells of the word line WL3 may be data stored in the first memory area 1411 and used to perform the 1-step and 2-step program operations of the word line WL3, random data stored in the first memory area 1411, or data provided from the memory controller 1200.

Figure 12:
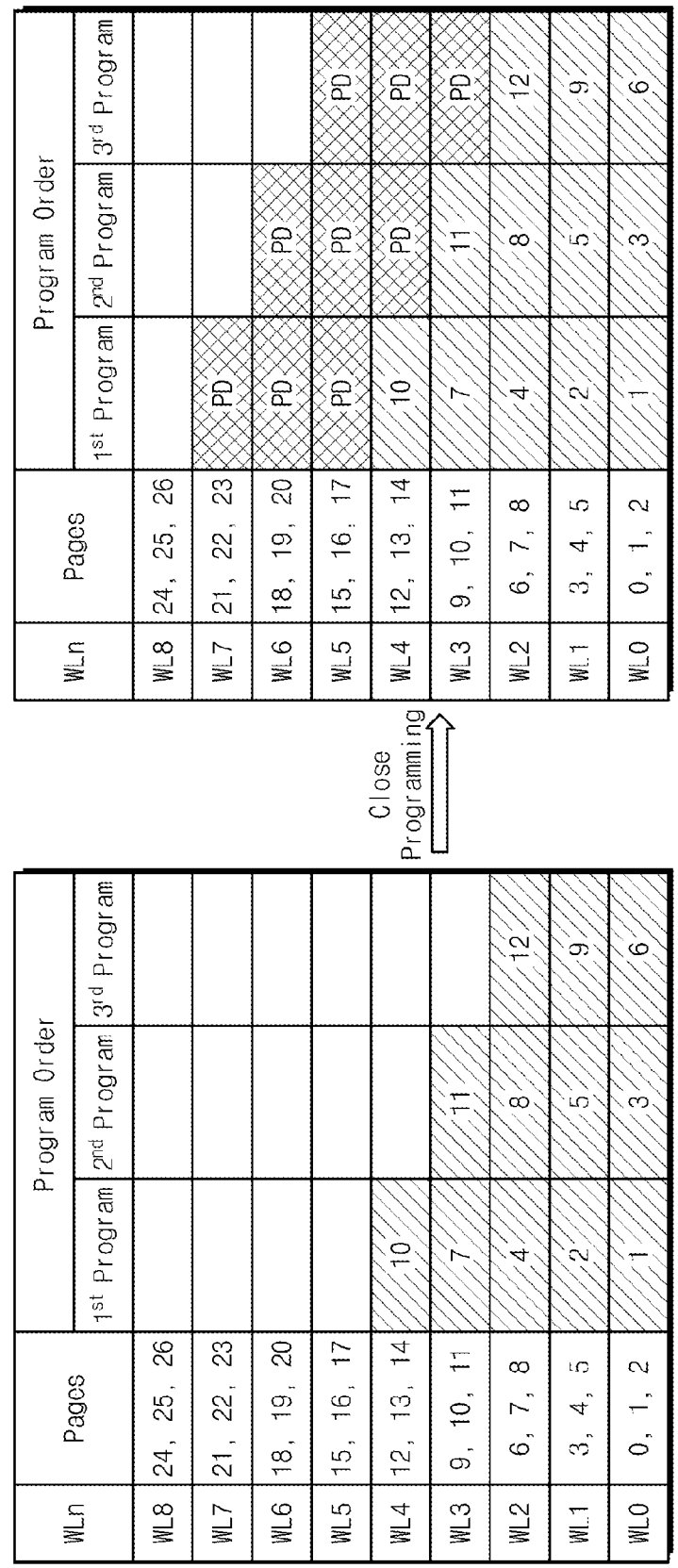
FIG. 12 is a diagram illustrating still another example in which an open word line is closed, according to an embodiment of the inventive concept.

FIG. 12 is a diagram illustrating still another example in which an open word line is closed, according to an embodiment of the inventive concept.

In FIG. 12, there is illustrated a program order associated with nine word lines WL0 to WL8. Each of second memory blocks in a second memory area 1412 may be programmed via a reprogram operation. It is assumed that a write operation on a selected second memory block of the second memory area 1412 ends as illustrated by the left table of FIG. 12. In this case, a word line WL2 is an open word line. In an embodiment of the inventive concept, as illustrated in FIG. 12, the open word line WL2 may be closed by performing a 1-step program operation on memory cells of an upper word line WL5 adjacent to the open word line WL2, a 2-step program operation on memory cells on an upper word line WL4 adjacent to the open word line WL2, and a 3-step program operation on memory cells of an upper word line WL3 immediately adjacent to the open word line WL2. In this case, 6-page data stored in memory cells connected to the word lines WL3 and WL4 may be invalid.

However, unlike the close operation described with reference to FIG. 11, the word lines WL3 and WL4 also may be closed to secure validity of 6-page data stored in memory cells connected to the word lines WL3 and WL4. The word lines WL3 and WL4 may be closed by performing a 3-step program operation on memory cells of the word line WL3, 2-step and 3-step program operations on memory cells of the word line WL4, 1-step, 2-step, and 3-step program operations on memory cells of the word line WL5, 1-step and 2-step program operations on memory cells of the word line WL6, and a 1-step program operation on memory cells of the word line WL7. Herein, data needed for the close operation to secure validity of 6-page data stored in memory cells connected to the word lines WL3 and WL4 may be decided as follows.

Data used to perform the 3-step program operation on the word line WL3 may be data stored in the first memory area 1411 and used to perform the 1-step and 2-step program operations on the word line WL3. Data used to perform the 2-step and 3-step program operations on the word line WL4 may be data stored in the first memory area 1411 and used to perform the 1-step program operation on the word line WL4. Data used to perform the 1-step, 2-step, and 3-step program operations on the word line WL5, data used to perform the 1-step and 2-step program operations on the word line WL6, and data used to perform the 1-step program operation on the word line WL7 may be random data stored in the first memory area 1411 or data provided from the memory controller 1200. Herein, the 1-step, 2-step, and 3-step program operations may be performed on the word lines WL3 to WL7 in the same program order as described in FIG. 2.

In exemplary embodiments, memory cells connected to word lines existing between the word line WL7 and a string selection line may be used after the open word line closing operation is completed.

FIG. 13 is a diagram illustrating still another example in which an open word line is closed, according to an embodiment of the inventive concept.

According to the open word line closing method illustrated in FIG. 13, when an open word line is generated, 1-step, 2-step, and/or 3-step program operations may be performed on memory cells connected to word lines at which at least one of 1-step, 2-step, and/or 3-step program operations is not completed. At this time, the 1-step, 2-step, and/or 3-step program operations may be performed using data provided from the memory controller 1200 or random data stored in the first memory area 1411, for example. An empty storage space is then filled with padding data after the 1-step, 2-step, and/or 3-step program operations on the memory cells connected to the upper word lines are completed.

Below, the open word line closing methods described with reference to FIGS. 10, 11 and 12 may be referred to as a first close policy, and the open word line closing method described with reference to FIG. 13 may be referred to as a second close policy.

Figure 14:
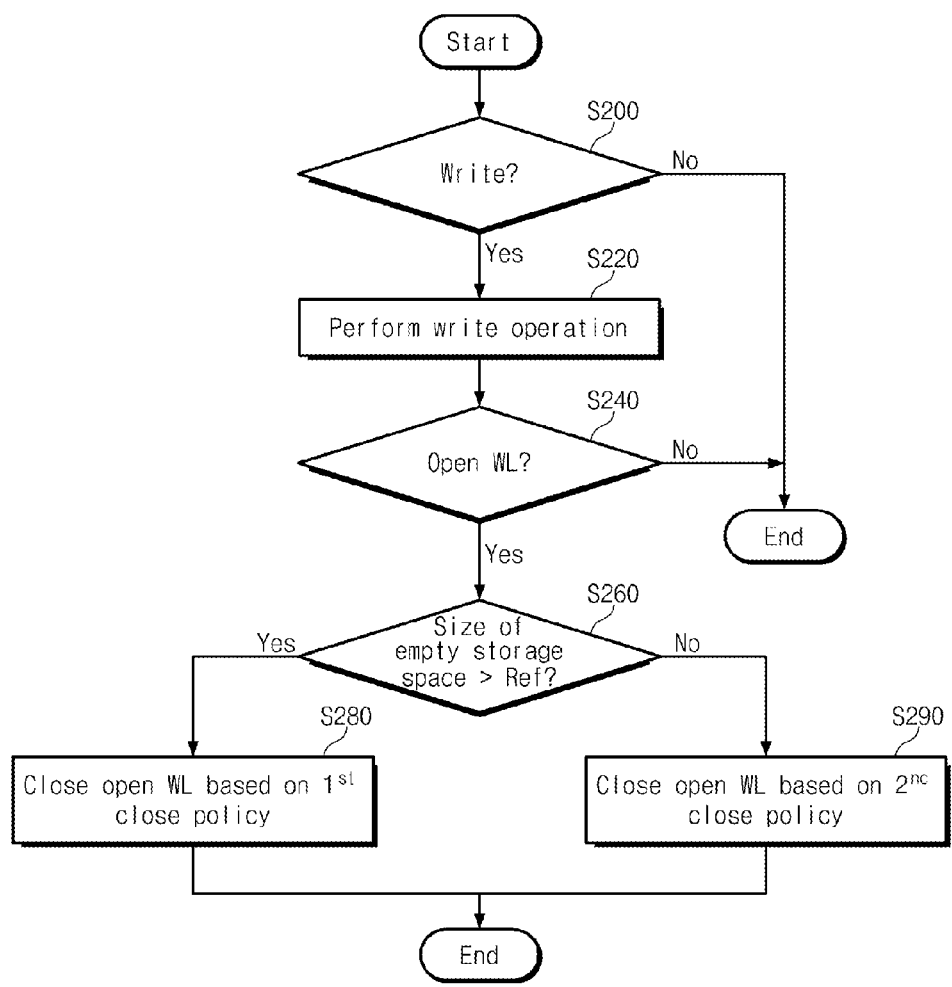
FIG. 14 is a flow chart illustrating a method of programming a memory system, according to another embodiment of the inventive concept.

FIG. 14 is a flow chart illustrating a program method, according to another embodiment of the inventive concept.

In operation S200, it is determined whether a write operation is requested. Herein, the write operation may be requested externally by an external device or internally by the memory controller 1200. In exemplary embodiments, the write operation may be a write operation in the second memory area 1412. The write operation in the second memory area 1412 may be performed using data stored in the first memory area 1411. When it is determined that the write operation is not required, the process ends. When it is determined that the write operation is required, the write operation is performed in the second memory area 1412 in operation S220.

After the write operation in the second memory area 1412 is performed, in operation S240, the memory controller 1200 determines whether an open word line has been generated in the second memory area 1412. For example, the memory controller 1200 may determine whether an open word line has been generated in a selected second memory block of the second memory area 1412. When it is determined that an open word line has not been generated, the method ends. When it is determined that an open word line has been generated, the method proceeds to operation S260.

In operation S260, the memory controller 1200 determines whether the size of an empty storage space of the selected second memory block in which the open word line is generated exceeds a reference value. Herein, the reference value may be predetermined and is not limited to a specific size. When it is determined that the size of the empty storage space of the selected second memory block exceeds the reference value, the method proceeds to operation S280. In operation S280, the open word line is closed according to a first close policy, described above with reference to FIG. 10, 11 or 12. In this case, the empty storage space formed of memory cells of word lines not experiencing the reprogram operation may be used.

When it is determined that the size of the empty storage space of the selected second memory block does not exceed the reference value, the method proceeds to operation S290. In operation S290, the open word line is closed according to a second close policy described above with reference to FIG. 13. In this case, the empty storage space is filled with padding data. The method then ends.

Figure 15:
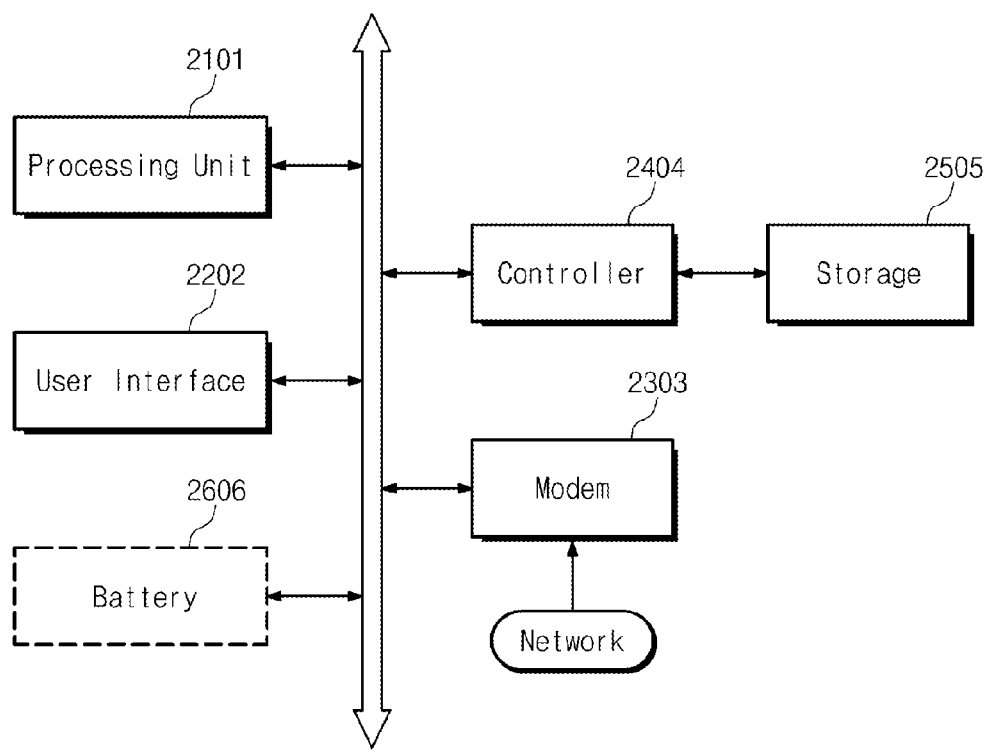
FIG. 15 is a block diagram schematically illustrating a computing system, according to an embodiment of the inventive concept.

FIG. 15 is a block diagram schematically illustrating a computing system, according to an embodiment of the inventive concept. The computing system includes a processing unit 2101, a user interface 2202, a modem 2303 such as a baseband chipset, a memory controller 2404, and storage medium 2505.

The memory controller 2404 may be configured substantially the same as memory controller 1200 illustrated in FIG. 5, and the storage medium 2505 may be formed of nonvolatile memory device 1400 illustrated in FIG. 6. For example, when a program operation is performed, the memory controller 2404 may determine whether an open word line has been generated in a second memory block of a second memory area 1412. When an open word line has been generated in the second memory block of the second memory area 1412, the memory controller 2404 controls the nonvolatile memory device of the storage medium 2505 such that the open word line in the second memory block of the second memory area 1412 is closed.

N-bit data (N an integer equal to or greater than 1) processed/to be processed by the processing unit 2101 may be stored in the storage medium 2505 through the memory controller 2404. In the event that the computing system is a mobile device, a battery 2606 may be further included in the computing system to supply an operating voltage thereto. Although not illustrated in FIG. 15, the computing system may further comprise an application chipset, a camera image processor (CIS), a mobile DRAM, and the like.

Figure 16:
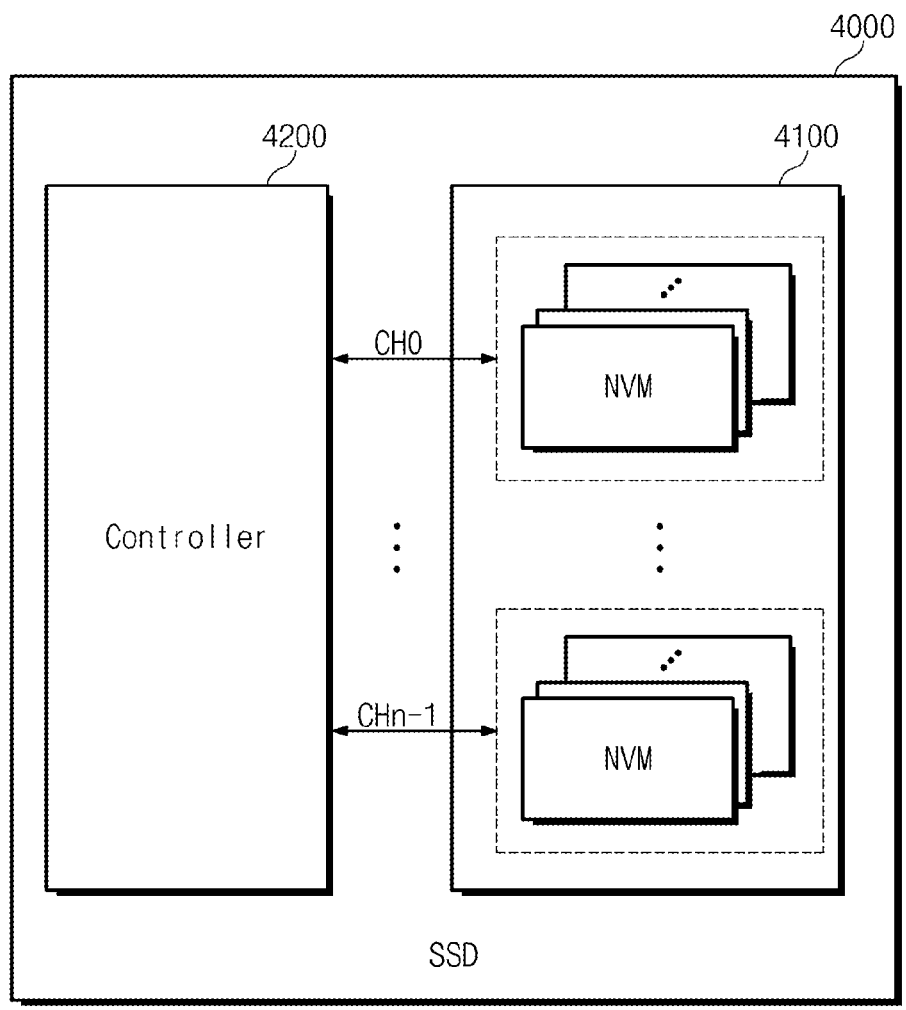
FIG. 16 is a block diagram schematically illustrating a solid state drive, according to an embodiment of the inventive concept.

FIG. 16 is a block diagram schematically illustrating a solid state drive, according to an embodiment of the inventive concept.

Referring to FIG. 16, a solid state drive (SSD) 4000 includes storage medium 4100 and a controller 4200. The storage medium 4100 is connected to the controller 4200 via a plurality of channels CH0 to CHn−1, each of which is commonly connected to a plurality of nonvolatile memories. The controller 4200 may be configured substantially the same as memory controller 1200 illustrated in FIG. 5, and each of the nonvolatile memory devices of the storage medium 4100 may be formed of nonvolatile memory device 1400 illustrated in FIG. 6. For example, when a program operation is performed, the controller 4200 may determine whether an open word line has been generated in a second memory block of a second memory area 1412. In the case that an open word line has been generated in the second memory block of the second memory area 1412, the controller 4200 controls the nonvolatile memory device of the storage medium 4100 such that the open word line of the second memory block of the second memory area 1412 is closed.

Figure 17:
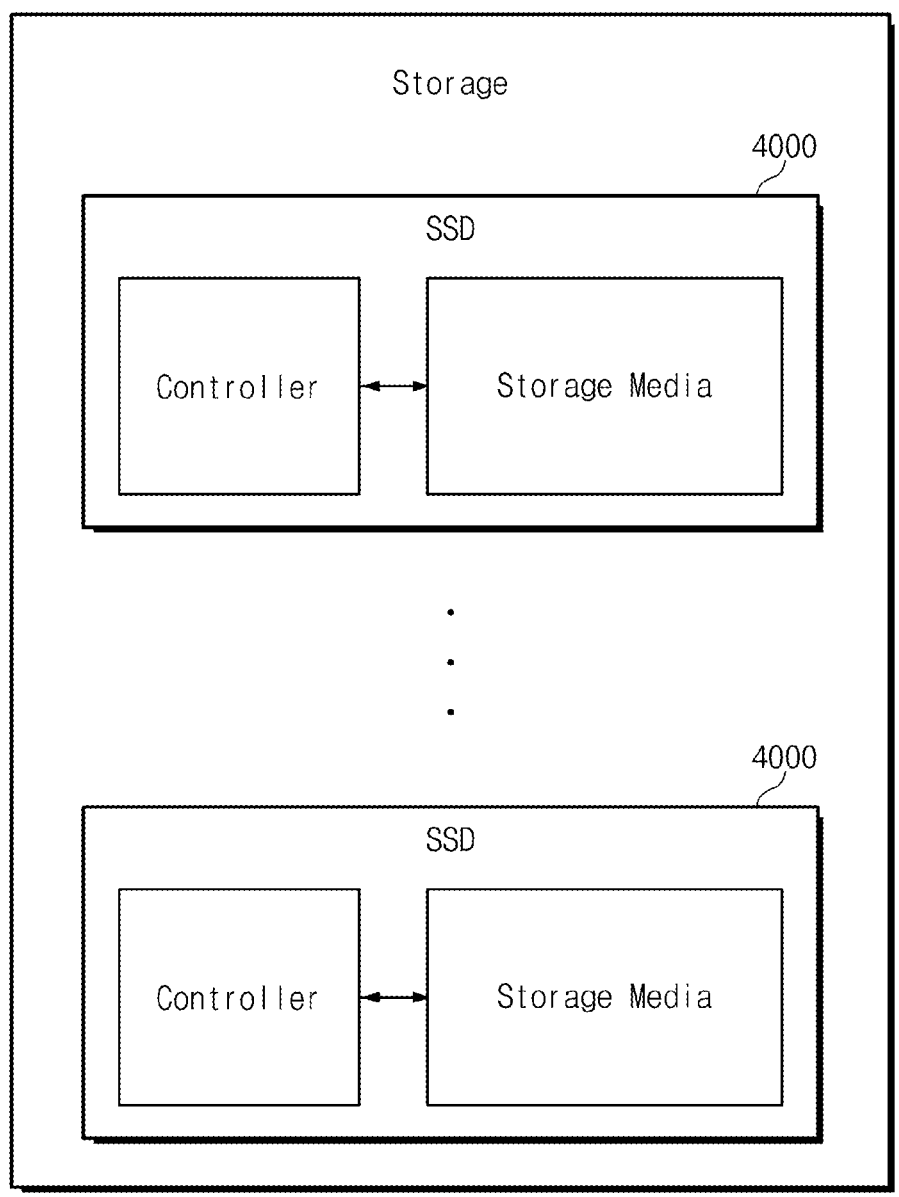
FIG. 17 is a block diagram schematically illustrating storage using a solid state drive in FIG. 16, according to an embodiment of the inventive concept.
Figure 18:
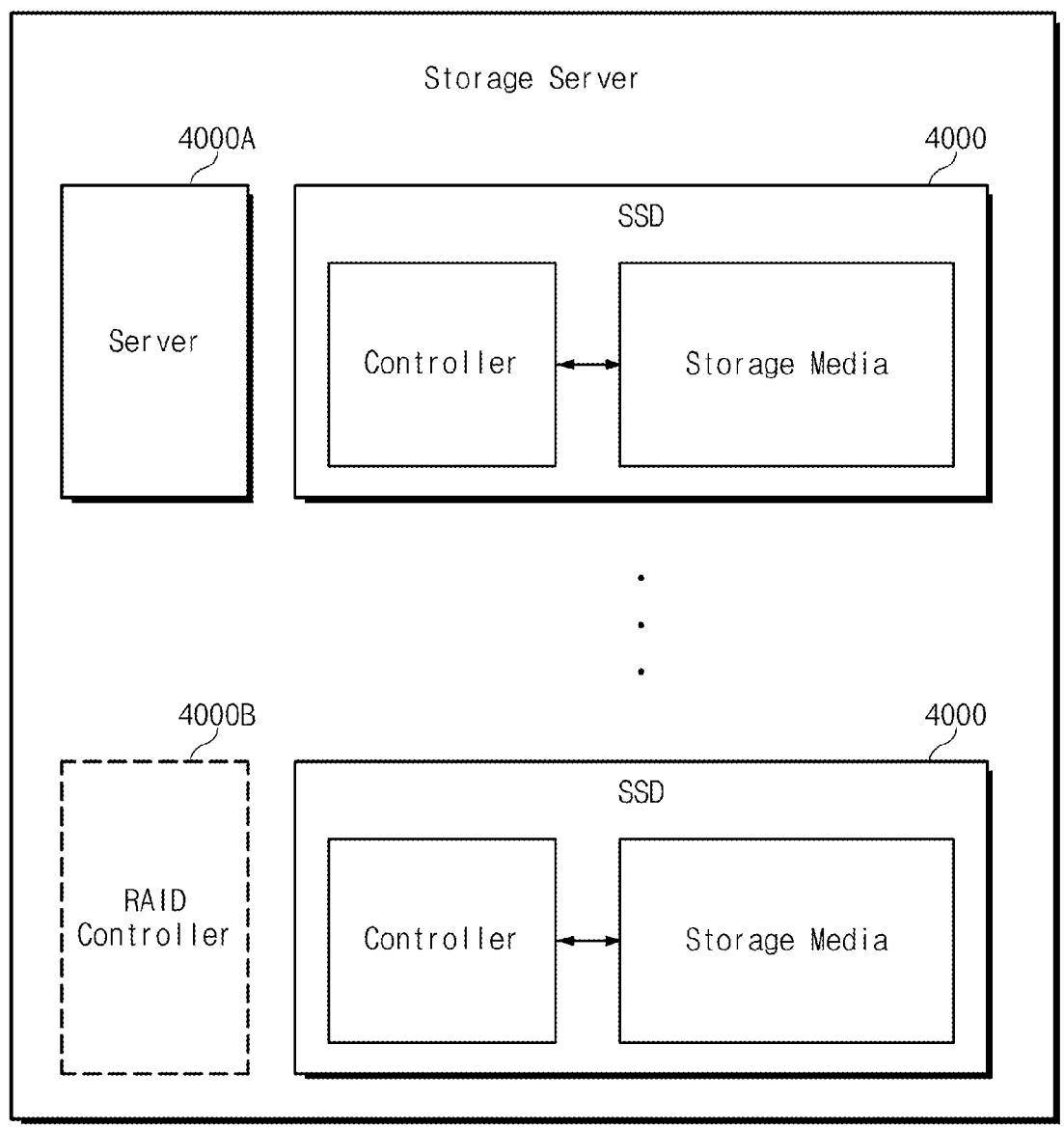
FIG. 18 is a block diagram schematically illustrating a storage server using a solid state drive in FIG. 16, according to an embodiment of the inventive concept.

FIG. 17 is a block diagram schematically illustrating storage using a solid state drive in FIG. 16, and FIG. 18 is a block diagram schematically illustrating a storage server using a solid state drive in FIG. 16, according to embodiments of the inventive concept.

An SSD 4000 according to an embodiment of the inventive concept may be used to form the storage. As illustrated in FIG. 17, the storage may include a plurality of solid state drives 4000, which are configured the same as described in FIG. 16. The SSD 4000 according to an embodiment of the inventive concept also may be used to configure a storage sever. As illustrated in FIG. 18, a storage server includes a plurality of solid state drives 4000, which are configured the same as described in FIG. 16. The storage server further includes and a server 4000A, as well as a well-known RAID controller 4000B, as would be apparent to one of ordinary skill in the art.

Figure 19:
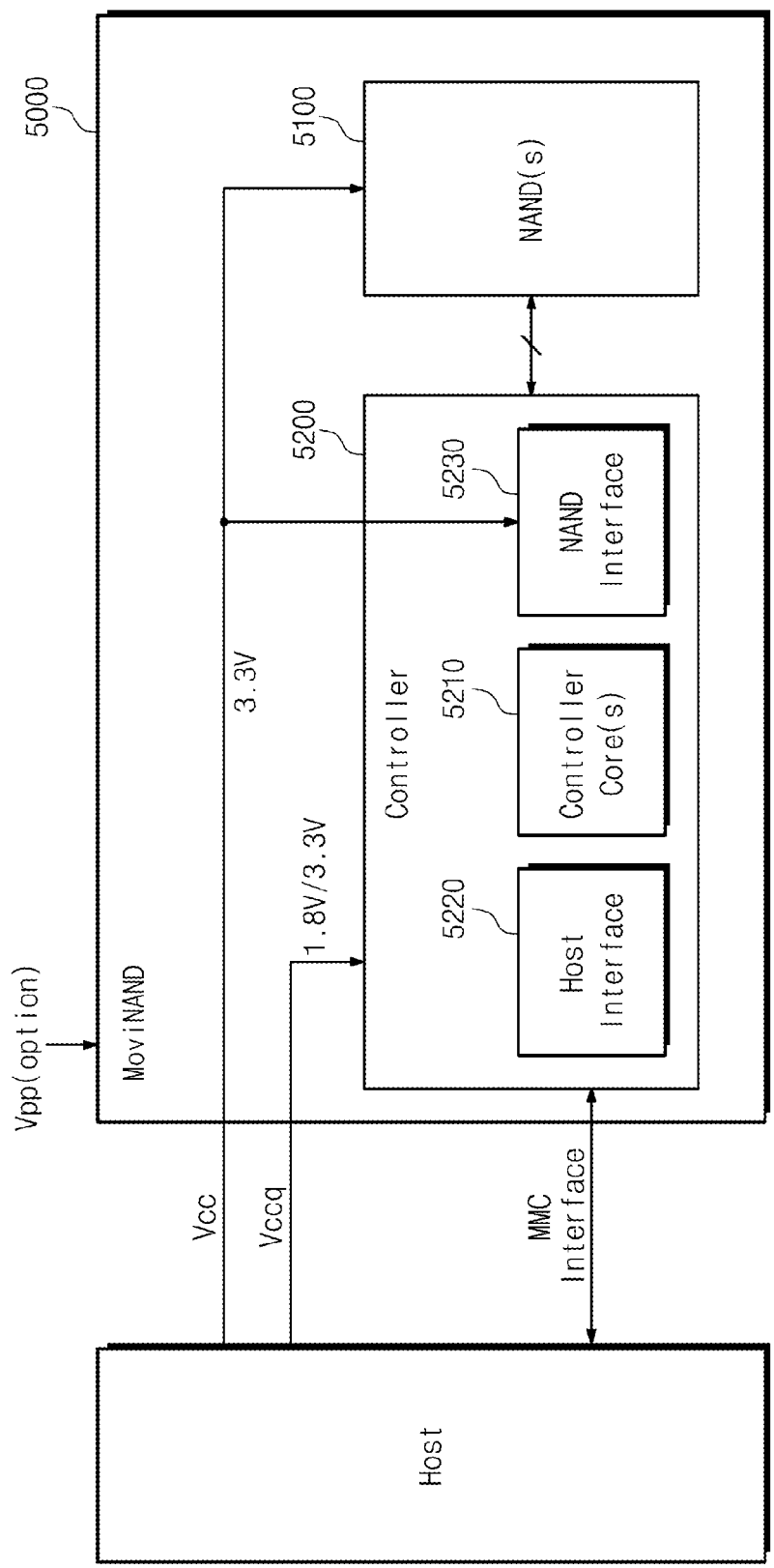
FIG. 19 is a block diagram schematically illustrating a moviNAND, according to an embodiment of the inventive concept.

FIG. 19 is a block diagram schematically illustrating a moviNAND, according to an embodiment of the inventive concept. Referring to FIG. 19, a moviNAND device 5000 may include at least one NAND flash memory device 5100 and a controller 5200. The moviNAND device 5000 may support the MMC 4.4 (or, referred to as "eMMC") standard, for example.

The NAND flash memory device 5100 may be a single data rate (SDR) NAND flash memory device or a double data rate (DDR) NAND flash memory device. In exemplary embodiments, the NAND flash memory device 5100 may include NAND flash memory chips. Herein, the NAND flash memory device 5100 may be implemented by stacking the NAND flash memory chips in one package (e.g., Fine-pitch Ball Grid Array (FBGA), etc.).

The controller 5200 may be configured substantially the same as memory controller 1200 illustrated in FIG. 5, and each of the NAND flash memory devices may be formed of nonvolatile memory device 1400 illustrated in FIG. 6. For example, when a program operation is performed, the controller 5200 determines whether an open word line has been generated in a second memory block of a second memory area 1412. When an open word line has been generated in the second memory block of the second memory area 1412, the controller 5200 controls the NAND flash memory device 5100 such that the open word line of memory block of the second memory area 1412 is closed.

The controller 5200 may be connected to the NAND flash memory device 5100 via a plurality of channels. The controller 5200 includes at least one controller core 5210, a host interface 5220, and a NAND interface 5230. The controller core 5210 may control overall operation of the moviNAND device 5000. The host interface 5220 may be configured to perform an MMC interface between the controller 5200 and a host, for example. The NAND interface 5230 may be configured to interface between the NAND flash memory device 5100 and the controller 5200. In exemplary embodiments, the host interface 5220 may be a parallel interface (e.g., an MMC interface). In other exemplary embodiments, the host interface 5220 of the moviNAND device 5000 may be a serial interface (e.g., UHS-II, UFS, etc.), for example.

The moviNAND device 5000 receives power supply voltages Vcc and Vccq from the host. Herein, the power supply voltage Vcc (e.g., about 3.3V) may be supplied to the NAND flash memory device 5100 and the NAND interface 5230, while the power supply voltage Vccq (e.g., about 1.8V/3.3V) may be supplied to the controller 5200. In exemplary embodiments, an external high voltage Vpp may be optionally supplied to the moviNAND device 5000.

The moviNAND device 5000 according to an embodiment of the inventive concept may be advantageous to store mass data as well as may have improved read characteristics. The moviNAND device 5000 according to an embodiment of the inventive concept is applicable to small and low-power mobile products (e.g., a Galaxy S, iPhone, etc.).

Figure 20:
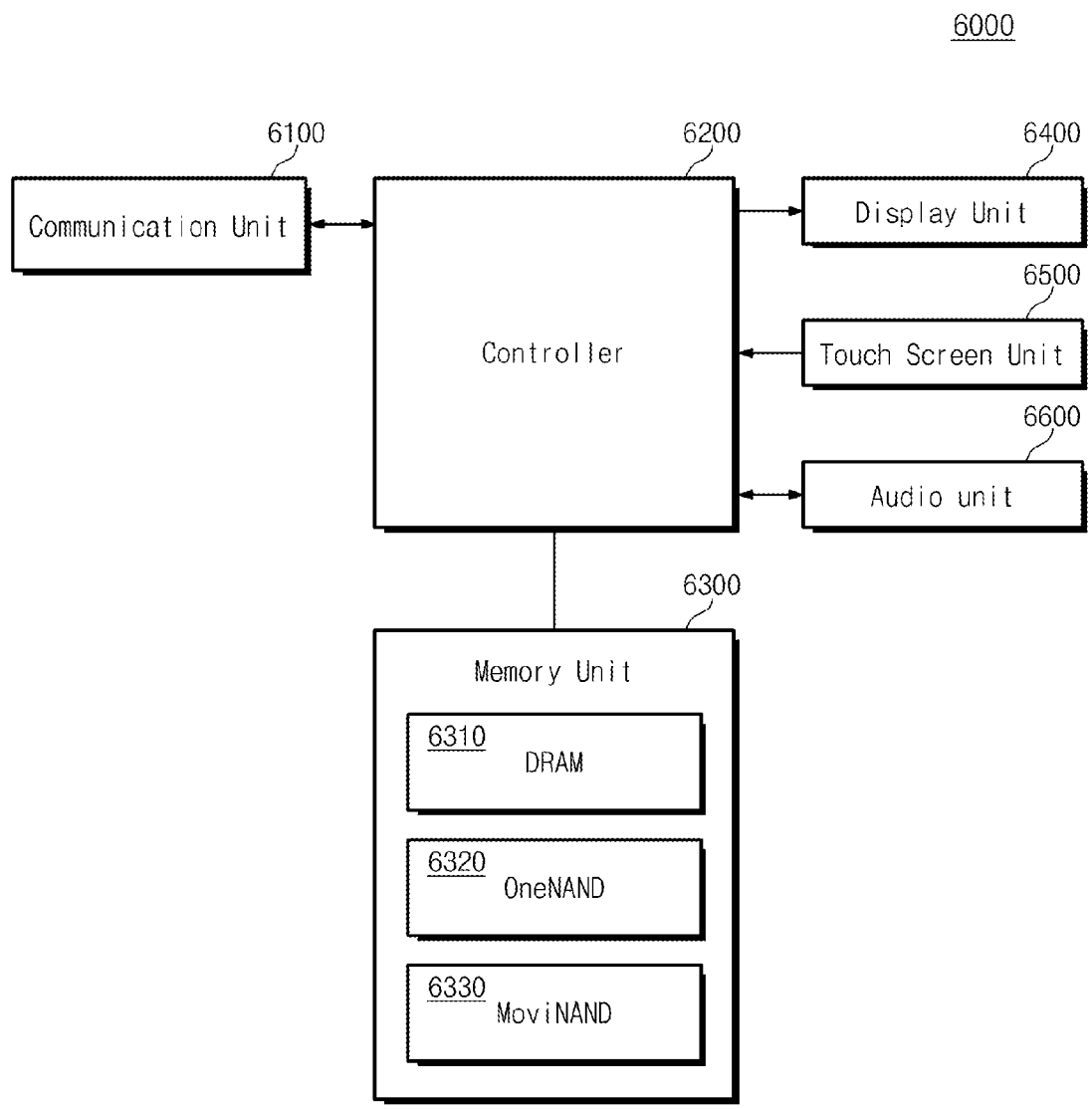
FIG. 20 is a block diagram schematically illustrating a communication device, according to an embodiment of the inventive concept.

FIG. 20 is a block diagram schematically illustrating a communication device, according to an embodiment of the inventive concept. Referring to FIG. 20, a communication device 6000 includes a communication unit 6100, a controller 6200, a memory unit 6300, a display unit 6400, a touch screen unit 6500, and an audio unit 6600. The memory unit 6300 includes at least one DRAM 6310, at least one OneNAND 6320, and at least one moviNAND 6330.

Descriptions of the mobile device are disclosed in U.S. Patent Publication No. 2010/0062715 to Kim et al. (published Mar. 11, 2010), 2010/00199081 to Lee et al. (published Aug. 5, 2010), 2010/0309237 to Roh (published Dec. 9, 2010) and 2010/0315325 to Hwang et al. (published Dec. 12, 2010), the entire contents of all of which are hereby incorporated by reference.

Figure 21:
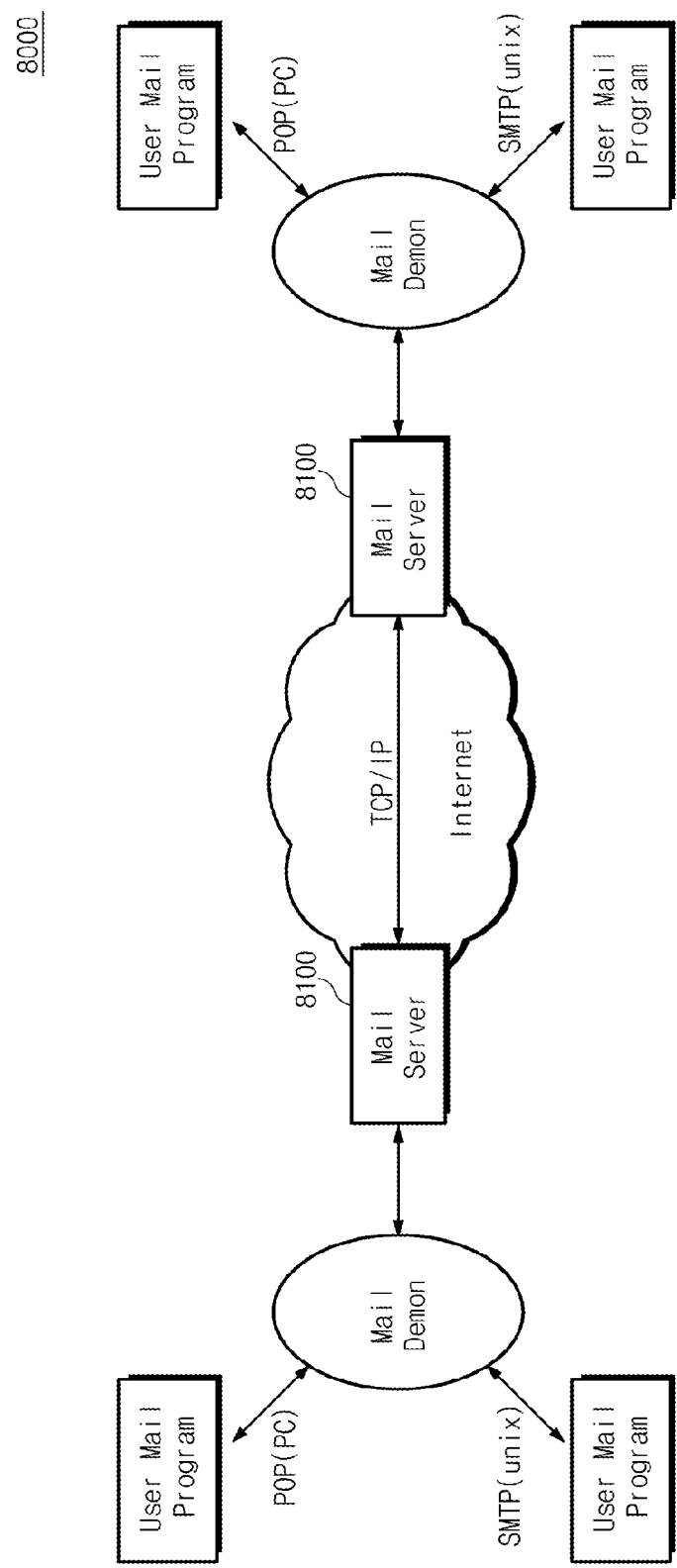
FIG. 21 is a block diagram schematically illustrating systems to which a data storage device according to embodiments of the inventive concept is applied.

FIG. 21 is a block diagram schematically illustrating systems to which a data storage device according to embodiments of the inventive concept is applied. As illustrated in FIG. 21, a solid state drive including a data storage device according to an embodiment of the inventive concept may be applied to a mail server 8100.

Figure 22:
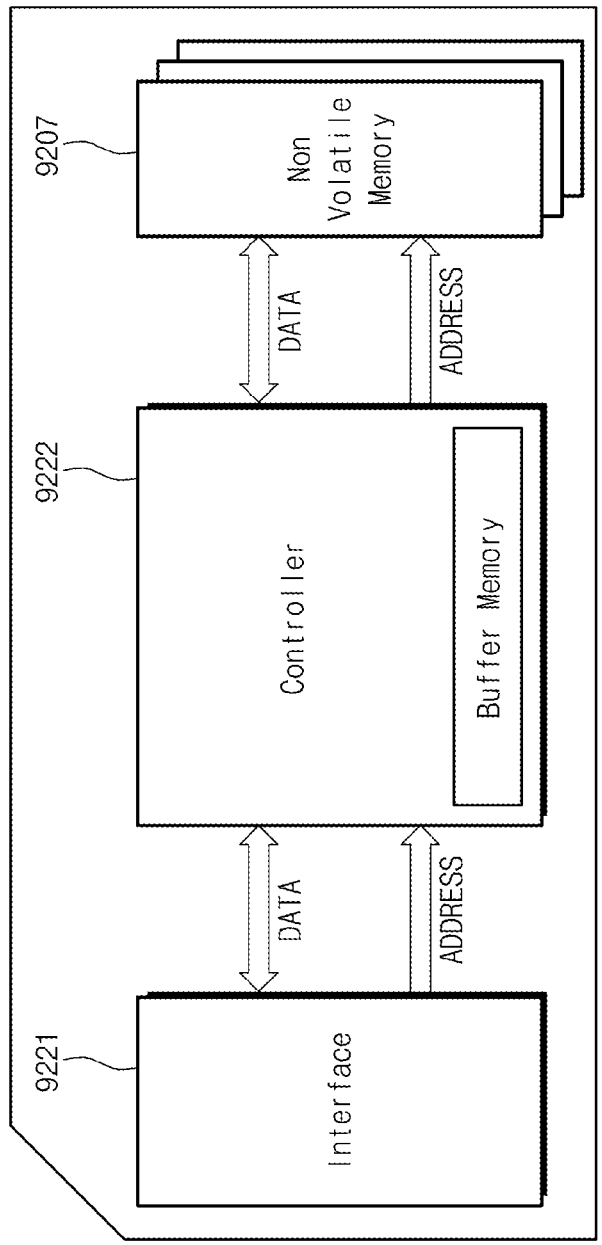
FIG. 22 is a block diagram schematically illustrating a memory card, according to an embodiment of the inventive concept.

FIG. 22 is a block diagram schematically illustrating a memory card, according to an embodiment of the inventive concept. The memory card may be, for example, an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 22, the memory card includes an interface circuit 9221 for interfacing with an external device or host (not shown), a controller 9222, including a buffer memory, for controlling operation of the memory card, and at least one nonvolatile memory device 9207. The controller 9222 may be a processor configured to control write and read operations of the nonvolatile memory device 9207. The controller 9222 may be coupled with the nonvolatile memory device 9207 and the interface circuit 9221 via a data bus and an address bus. The interface circuit 9221 may interface with a host via a card protocol (e.g., SD/MMC) for data exchange between the host and the memory card.

The controller 9222 may be configured substantially the same as memory controller 1200 illustrated in FIG. 5, and the nonvolatile memory device may be formed of nonvolatile memory device 1400 illustrated in FIG. 6. For example, when a program operation is performed, the controller 9222 may determine whether an open word line has been generated in a second memory block of a second memory area 1412. When an open word line has been generated in the second memory block of the second memory area 1412, the controller 9222 controls the nonvolatile memory device 9207 such that the open word line of memory block of the second memory area 1412 is closed.

Figure 23:
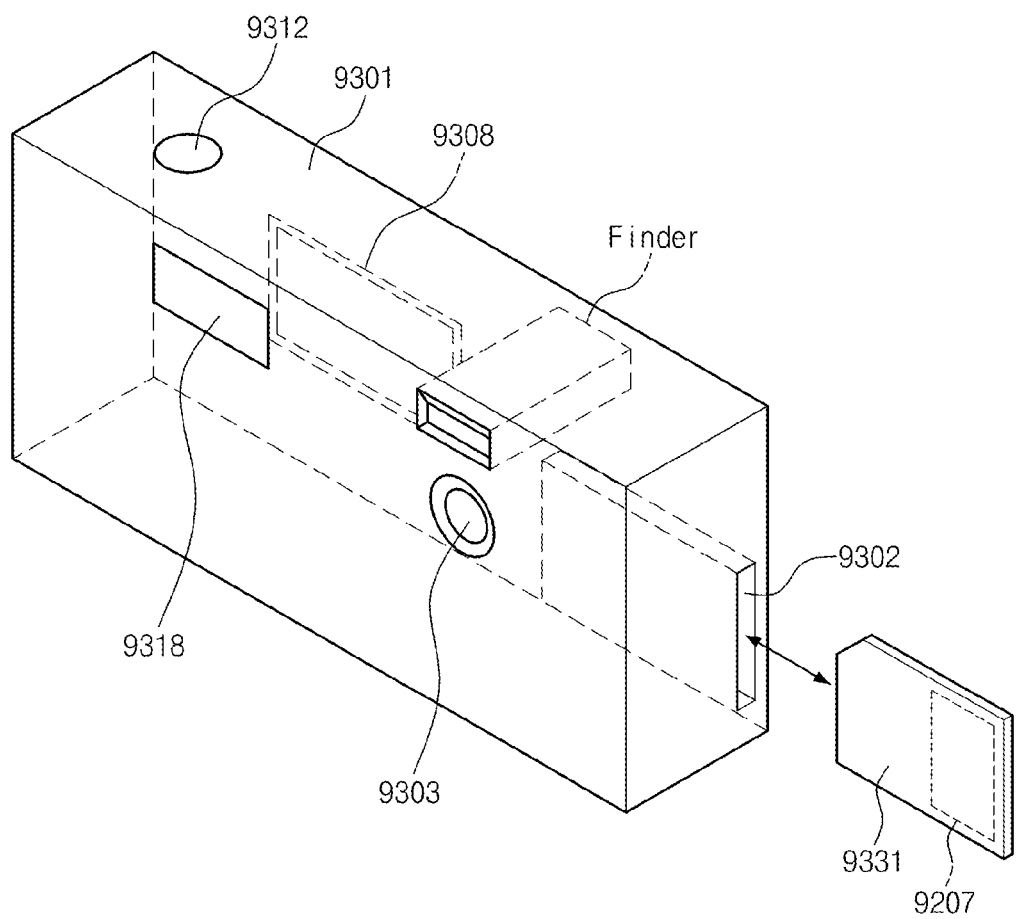
FIG. 23 is a block diagram schematically illustrating a digital still camera, according to an embodiment of the inventive concept.

FIG. 23 is a block diagram schematically illustrating a digital still camera, according to an embodiment of the inventive concept.

Referring to FIG. 23, a digital still camera includes a body 9301, a slot 9302, a lens 9303, a display circuit 9308, a shutter button 9312, a strobe 9318, and the like. The memory card 9331 may include a memory system, including a memory controller and a nonvolatile memory device, as described in FIG. 4. For example, when a program operation is performed, the memory controller determines whether an open word line has been generated in a second memory block of a second memory area 1412. When an open word line has been generated in the second memory block of the second memory area 1412, the memory controller controls the nonvolatile memory device such that the open word line of memory block of the second memory area 1412 is closed.

If the memory card 9331 is a contact type, an electric circuit on a circuit board may be electrically contacted with the memory card 9331 when it is inserted in the slot 9302. In the event that the memory card 9331 is a non-contact type, an electric circuit on a circuit board may communicate with the memory card 9331 in a radio-frequency manner, for example.

Figure 24:
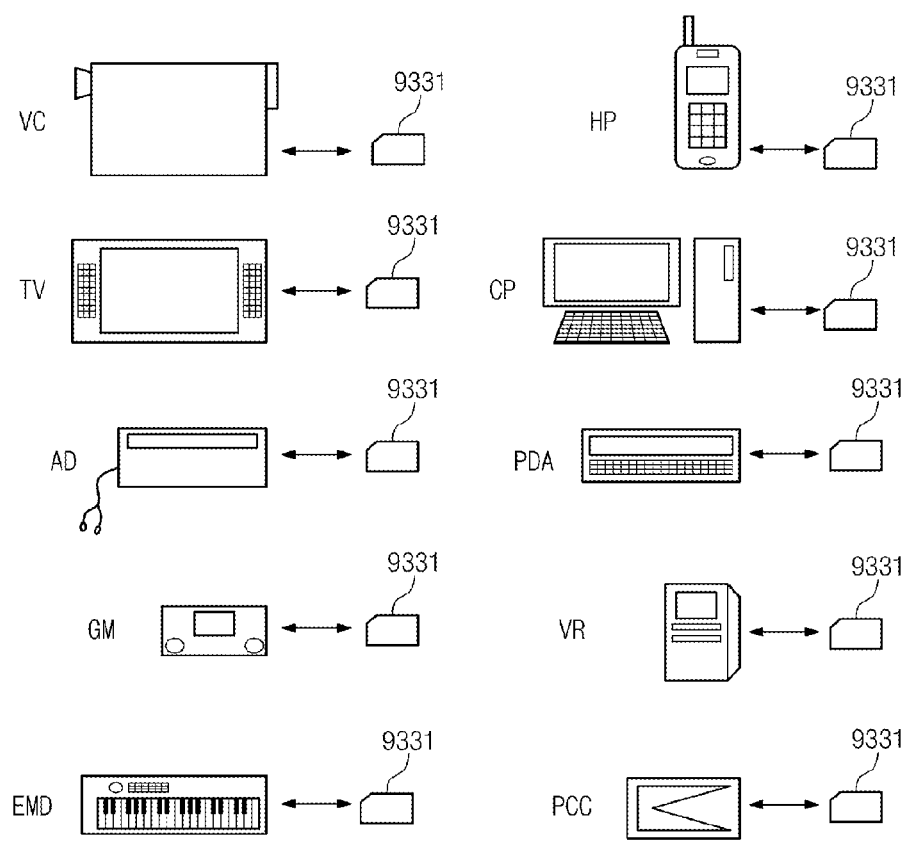
FIG. 24 is a diagram schematically illustrating various systems to which a memory card in FIG. 23 is applied, according to embodiments of the inventive concept.

FIG. 24 is a block diagram schematically illustrating various systems to which a memory card in FIG. 23 is applied. Referring to FIG. 22, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In exemplary embodiments, memory cells may be formed of a variable resistance memory cell. An example of a variable resistance memory cell and a memory device including the same are disclosed in U.S. Pat. No. 7,529,124 to Cho et al. (issued May 5, 2009), the entire contents of which are hereby incorporated by reference.

In other exemplary embodiments, memory cells may be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like. Examples of memory devices having a charge trap flash structure as a charge storage layer are disclosed in U.S. Pat. No. 6,858,906 to Lee et al. (issued Feb. 22, 2005) and U.S. Patent Publication Nos. 2004/0169238 to Lee et al. (published Sep. 2, 2004) and 2006/0180851 to Lee et al. (published Aug. 17, 2006), the entire contents of all of which are hereby incorporated by reference. A source-drain free flash structure is disclosed in KR Patent No. 673020, the entire contents of which are incorporated by reference herein.

A non-volatile memory device and/or a memory controller according to embodiments of the inventive concept may be packed using various types of packages. For example, a non-volatile memory device or a memory controller according to embodiments of the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system, comprising:
a nonvolatile memory device including a three-dimensional array structure comprising a plurality of memory blocks, wherein each of the plurality of memory blocks includes a plurality of charge trap memory cells, each of the plurality of memory cells comprising a charge storage layer formed of an insulation film and connected to a plurality of word lines, respectively, and
a memory controller configured to control the nonvolatile memory device to close an open word line in at least one memory block by performing at least one program operation on charge trap memory cells connected to each of all word lines between the open word line and a string selection line, after a program operation on the at least one memory block is performed,
wherein the open word line is a first word line adjacent to a second word line,
wherein the first word line is connected to N-step programmed charge trap memory cells, N being a positive integer,
wherein the second word line is connected to M-step programmed charge trap memory cells, M being an integer less than the N.

2. The memory system of claim 1, wherein data stored in the charge trap memory cells connected to each of all word lines between the open word line and a string selection line is invalid.

3. The memory system of claim 1, wherein the memory controller is configured to determine whether the open word line is generated in the at least one memory block, and close the open word line according to a result of the determination.

4. The memory system of claim 1, wherein the memory controller is further configured to determine whether a size of an empty storage space in the at least one memory block is greater than a reference size, and
wherein the empty storage space indicates a storage space of the charge trap memory cells connected to the each of the all word lines between the open word line and the string selection line.

5. The memory system of claim 4, wherein the memory controller is further configured to perform the program operation on the charge trap memory cells connected to the each of the all word lines between the open word line and the string selection line, when the size of the empty storage space is smaller than the reference size.

6. The memory system of claim 1, wherein the memory controller is configured to perform the at least one program operation on the charge trap memory cells connected to the each of the all word lines between the open word line and the string selection line using padding data.

7. The memory system of claim 6, wherein the padding data is random data.

8. The memory system of claim 6, wherein the padding data is data provided from the memory controller.

9. The memory system of claim 1, wherein the N-step programmed charge trap memory cells are charge trap memory cells subjected to N times program operations before erase,
wherein each of the N times program operations comprises a plurality of program loops.

10. The memory system of claim 1, wherein the memory controller is configured to further program the M-step programmed charge trap memory cells before the at least one memory block is erased.

11. The memory system of claim 1, wherein the memory controller is configured to perform the at least one program operation such that the charge trap memory cells connected to the each of the all word lines between the open word line and a string selection line are the N-step programmed charge trap memory cells.

12. A memory system, comprising:
a nonvolatile memory device including a plurality of first memory blocks configured to store 1-bit data per cell and a plurality of second memory blocks configured to store 3-bit data per cell; and
a memory controller configured to control the nonvolatile memory device to close an open word line generated in a second memory block of the plurality of second memory blocks by performing at least one program operation on memory cells connected to a first upper word line adjacent to the open word line, after a program operation is performed on the second memory block,
wherein the open word line is a first word line adjacent to a second word line,
wherein the first word line is connected to N-step programmed charge trap memory cells, N being a positive integer,
wherein the second word line is connected to M-step programmed charge trap memory cells, M being an integer less than the N.

13. The memory system of claim 12, wherein the memory controller is configured to perform the program operation on the memory cells connected to the first upper word line based on random data.

14. The memory system of claim 12, the memory controller is configured to perform the program operation on the memory cells connected to the first upper word line based on 3-page data stored in one of the first memory blocks.

15. The memory system of claim 12, wherein the memory controller is configured to perform the program operation on the memory cells connected to the first upper word line based on data provided from the memory controller.

16. The memory system of claim 12, wherein the memory controller is further configured to close the first upper word line by performing a program operation on a second upper word line adjacent to the first upper word line.

17. The memory system of claim 12, wherein data provided from the memory controller is stored in the plurality of first memory blocks via a buffer program operation, and the data stored in the first memory blocks is stored in the plurality of second memory blocks via a main program operation.

18. An operation method of a memory system which includes a nonvolatile memory and a memory controller configured to control the nonvolatile memory device, the nonvolatile memory including a three-dimensional array structure comprising a plurality of memory blocks, wherein each of the plurality of memory blocks includes a plurality of charge trap memory cells, and each of the plurality of memory cells comprising a charge storage layer formed of an insulation film and connected to a plurality of word lines, respectively, the operation method comprising:
performing a program operation on at least one memory block; and
closing an open word line generated in the at least one memory block by performing at least one program operation on charge trap memory cells connected to at least one word line between the open word line and a string selection line, after the program operation is performed on the at least one memory block, wherein the open word line is a first word line adjacent to a second word line,
wherein the first word line is connected to N-step programmed charge trap memory cells, N being a positive integer,
wherein the second word line is connected to M-step programmed charge trap memory cells, M being an integer less than the N.

19. The operation method of claim 18, further comprising:
determining whether the open word line is generated in the at least one memory block, and
wherein the closing the open word line comprises closing the open word line when the open word line is generated in the at least one memory block.

20. The operation method of claim 18, further comprising:
determining whether a size of an empty storage space in the at least one memory block is greater than a reference size,
wherein the closing the open word line comprises closing the open word line according to a result of the determining, and
wherein the empty storage space indicates a storage space of the charge trap memory cells connected to the each of the all word lines between the open word line and the string selection line.

* * * * *